US010718661B2

(12) United States Patent
McDonald et al.

(10) Patent No.: US 10,718,661 B2
(45) Date of Patent: Jul. 21, 2020

(54) INTEGRATED MICROFABRICATED VAPOR CELL SENSOR WITH TRANSPARENT BODY HAVING TWO INTERSECTING SIGNAL PATHS

(71) Applicant: Texas Instruments Incorporated, Dallas, TX (US)

(72) Inventors: David Brian McDonald, Sunnyvale, CA (US); Roozbeh Parsa, Portola Valley, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 432 days.

(21) Appl. No.: 15/622,806

(22) Filed: Jun. 14, 2017

(65) Prior Publication Data
US 2018/0364096 A1 Dec. 20, 2018

(51) Int. Cl.
*G01J 1/42* (2006.01)
*G01R 33/032* (2006.01)
*G04F 5/14* (2006.01)

(52) U.S. Cl.
CPC .............. *G01J 1/42* (2013.01); *G01R 33/032* (2013.01); *G04F 5/14* (2013.01)

(58) Field of Classification Search
CPC G01R 33/032; G01R 33/028; G01R 33/0286; G01J 1/42; G04F 5/14
See application file for complete search history.

(56) References Cited

U.S. PATENT DOCUMENTS

| 4,436,420 A | 3/1984 | Depp |
| 7,479,234 B2 | 1/2009 | Benzel |
| 7,521,928 B2 | 4/2009 | Romalis |
| 7,852,163 B2 | 12/2010 | Braun |
| 7,944,317 B2 | 5/2011 | Strabley |
| 8,154,349 B2 | 4/2012 | Le Prado |
| 8,334,690 B2 | 12/2012 | Kitching |
| 9,763,314 B1 * | 9/2017 | Roper ...................... H05H 3/02 |

(Continued)

FOREIGN PATENT DOCUMENTS

| EP | 2498150 | 9/2012 |
| KR | 20130088556 | 8/2013 |

OTHER PUBLICATIONS

Eklund, E. Jesper, et al. "Glass-blown spherical microcells for chip-scale atomic devices." Sensors and Actuators A: Physical 143.1 (2008): 1775-180.

(Continued)

*Primary Examiner* — John R Lee
(74) *Attorney, Agent, or Firm* — Ray A. King; Charles A. Brill; Frank D. Cimino

(57) ABSTRACT

An integrated microfabricated vapor cell sensor includes a transparent sensor cell body. The cell body has a cavity for a sensor fluid vapor which is covered by a first plate attached to the cell body. The sensor has a first signal path extending from a first signal emitter, through the cell body, through the cavity, through the cell body again, and to a first signal detector, and a second signal path extending through the cavity. The second signal path intersects the first signal path in the cavity. The second signal path may extend through the cell body, or may extend through the first plate. The signal emitters and signal detectors are located in the integrated microfabricated vapor cell sensor.

18 Claims, 23 Drawing Sheets

(56) References Cited

U.S. PATENT DOCUMENTS

| | | | | |
|---|---|---|---|---|
| 2002/0163394 A1* | 11/2002 | Hollberg | ............... | G04F 5/14 |
| | | | | 331/94.1 |
| 2006/0022761 A1* | 2/2006 | Abeles | ............... | G04F 5/14 |
| | | | | 331/94.1 |
| 2008/0036367 A1 | 2/2008 | Eida | | |
| 2011/0128082 A1* | 6/2011 | Maki | ............... | G04F 5/14 |
| | | | | 331/94.1 |
| 2014/0062608 A1* | 3/2014 | Ridley | ............... | G04F 5/145 |
| | | | | 331/94.1 |
| 2015/0027908 A1* | 1/2015 | Parsa | ............... | F17C 3/00 |
| | | | | 206/0.7 |
| 2015/0130456 A1* | 5/2015 | Smith | ............... | G01R 33/26 |
| | | | | 324/301 |
| 2018/0364096 A1* | 12/2018 | McDonald | ............... | G01J 1/42 |
| 2019/0181871 A1* | 6/2019 | Matsuda | ............... | G04F 5/145 |

OTHER PUBLICATIONS

Youngner, D. W., et al. "A manufacturable chip-scale atomic clock." Solid-State Sensors, Actuators.

Petremand, "Microfabricated rubidium vapour cell with a thick glass core for small-scale atomic clock applications", Journal of Micromechanics and Microengineering 22, 2, 0250.

* cited by examiner

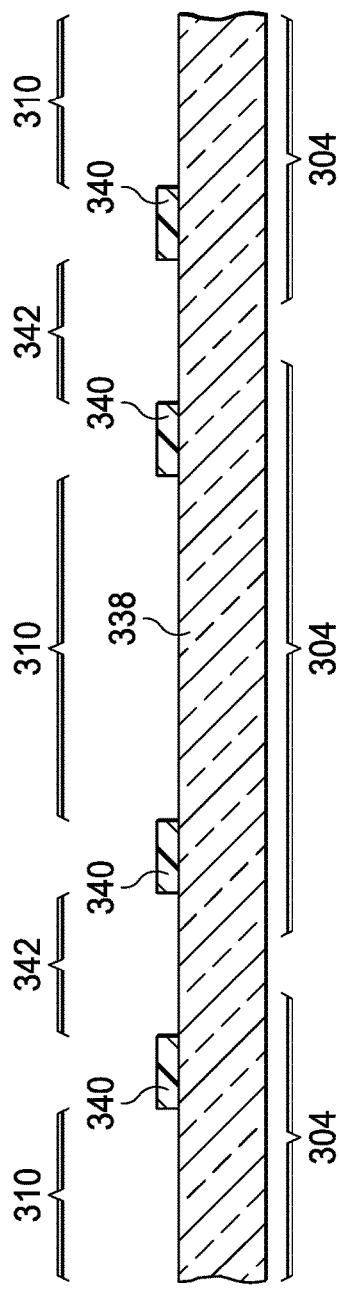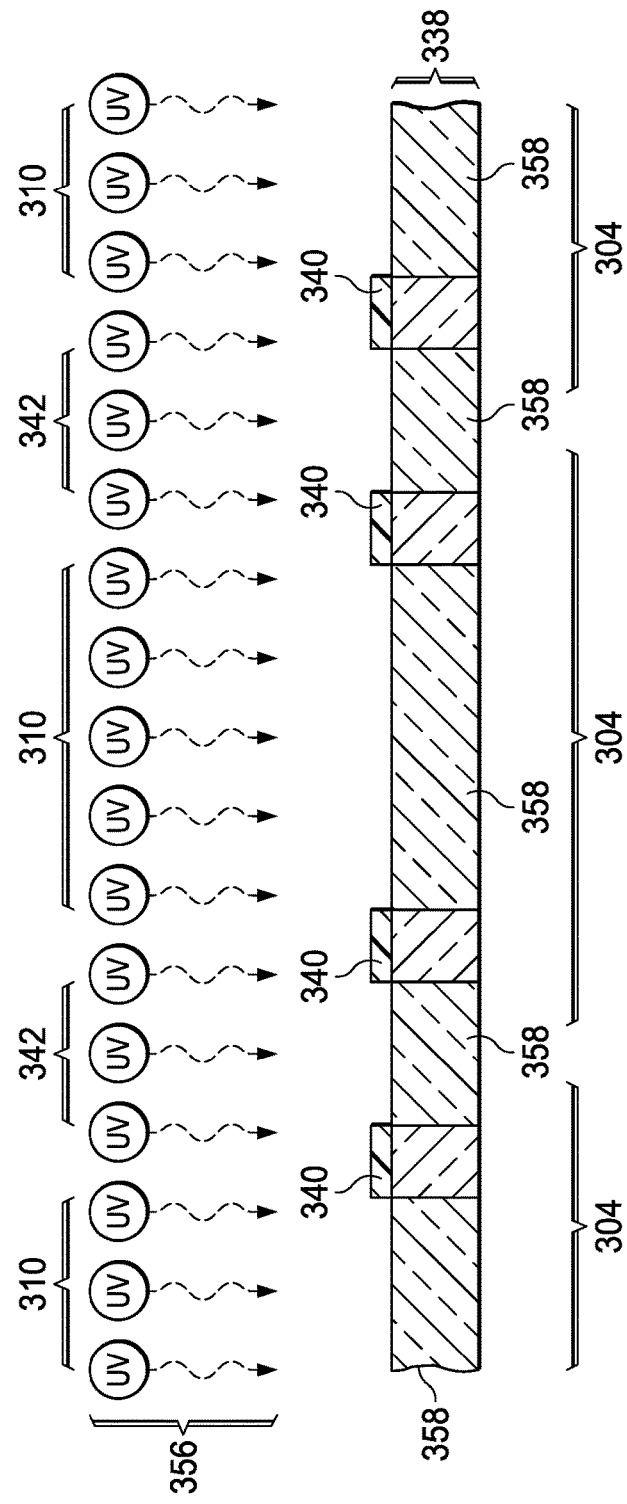

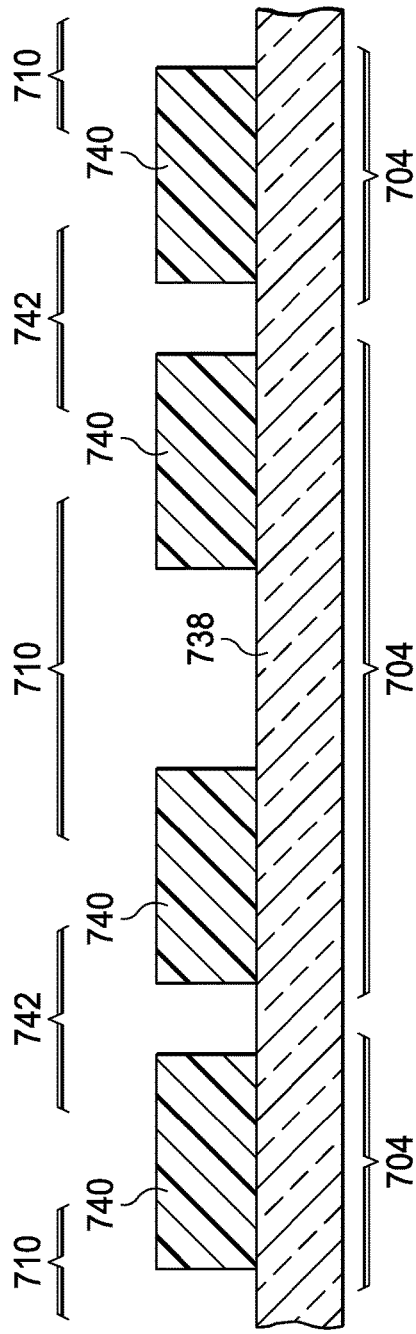
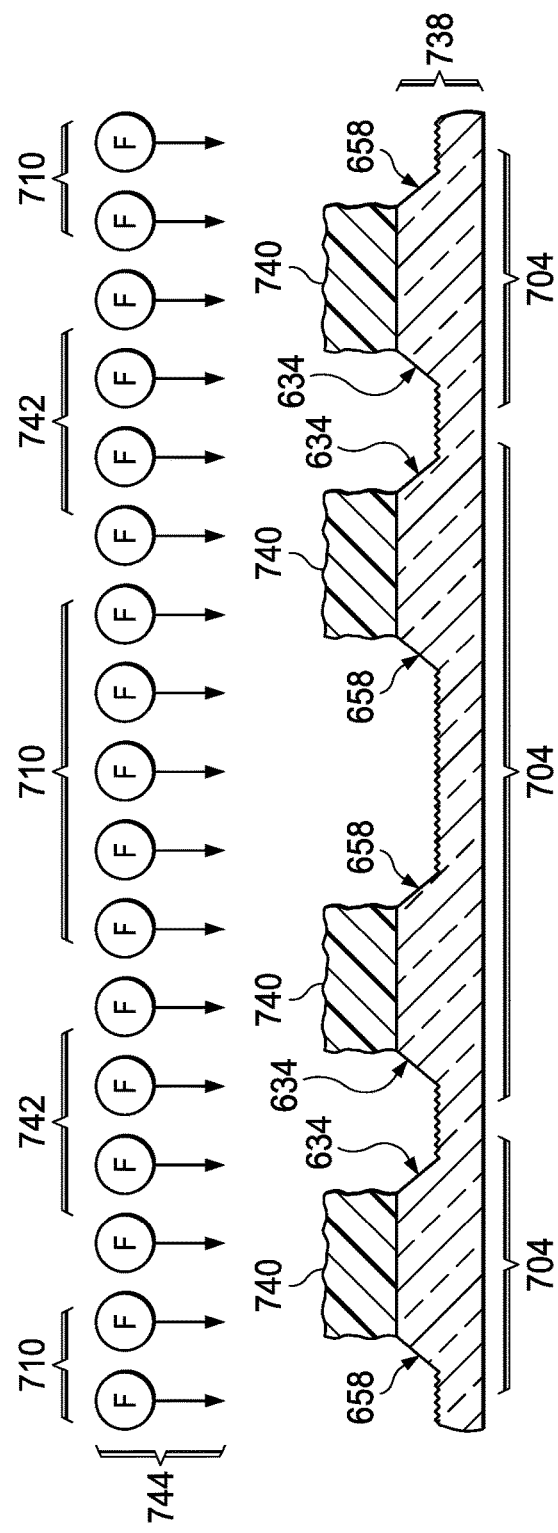
FIG. 7A
FIG. 7B

INTEGRATED MICROFABRICATED VAPOR CELL SENSOR WITH TRANSPARENT BODY HAVING TWO INTERSECTING SIGNAL PATHS

FIELD OF THE INVENTION

This invention relates to the field of microfabricated vapor cell sensors. More particularly, this invention relates to cell bodies of microfabricated vapor cell sensors.

BACKGROUND OF THE INVENTION

Microfabricated vapor cell sensors are used in chip-scale atomic clocks and magnetometers. The most common architecture of the cell body is a silicon body with a cavity for the vapor, such as alkali metal vapor, extending through the silicon body, sandwiched by glass windows, sealing the cavity. Optical signals are transmitted through one of the windows and received through the other window. The glass/silicon/glass structure is amenable to wafer scale production in microelectronic fabrication facilities, which keeps fabrication costs lower than building sensors individually.

Demands for higher performance have generated a need for microfabricated vapor cell sensors that support two perpendicular signal paths, which is difficult to achieve in a small package using the glass/silicon/glass structure. Other designs for microfabricated vapor cell sensors that support perpendicular signal paths have been proposed, but are not readily fabricated on a wafer scale, or in typical microelectronic fabrication facilities.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated microfabricated vapor cell sensor includes a sensor cell having a cell body of transparent material. A cavity in the cell body extends to a first surface of the cell body. A first plate is attached to the cell body on the first surface; the first plate is exposed to the cavity. A first signal path extends from a first signal emitter of the integrated microfabricated vapor cell sensor, through the cell body, through the cavity, through the cell body again, and to a first signal detector of the integrated microfabricated vapor cell sensor. A second signal path extends through the cavity. The second signal path intersects the first signal path in the cavity. The second signal path may extend through the cell body, or may extend through the first plate.

BRIEF DESCRIPTION OF THE VIEWS OF THE DRAWINGS

FIG. 3A through FIG. 3E depict a sensor cell, similar to that described in reference to FIG. 1, in successive stages of another example method of formation.

FIG. 7A through FIG. 7C depict a sensor cell, similar to that described in reference to FIG. 6A and FIG. 6B, in successive stages of an example method of formation.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated microfabricated vapor cell sensor is configured to have two signal paths extending through a sensor cell having a cell body of transparent material. The signal paths intersect in a cavity in the cell body. The cavity extends to a first surface of the cell body. A first plate is attached to the cell body on the first surface; the first plate is exposed to the cavity. Each signal path extends from a corresponding signal emitter, through the cavity, to a corresponding signal detector. The signal emitters and signal detectors are integrated into the integrated microfabricated vapor cell sensor, advantageously providing a small sensor form factor, suitable for mobile and low power applications. The integrated aspect of the integrated microfabricated vapor cell sensor implies the signal emitters and signal detectors are located within 10 millimeters of the sensor cell, and stands in contrast to laboratory scale sensors having a macroscopic assemblage of discrete parts. The integrated microfabricated vapor cell sensor may have an alkali metal such as cesium or rubidium in the cavity, and may be used as an atomic clock or magnetometer.

For the purposes of this disclosure, the term "lateral" is understood to refer to a direction parallel to a plane of a top surface or a bottom surface of the cell body, and the term "vertical" is understood to refer to a direction perpendicular to the plane of the top surface or bottom surface of the cell body. It is noted that terms such as top, bottom, over, above, and below are used in this disclosure. These terms should not be construed as limiting the position or orientation of a structure or element, but should be used to provide spatial relationship between structures or elements.

Figure 1:
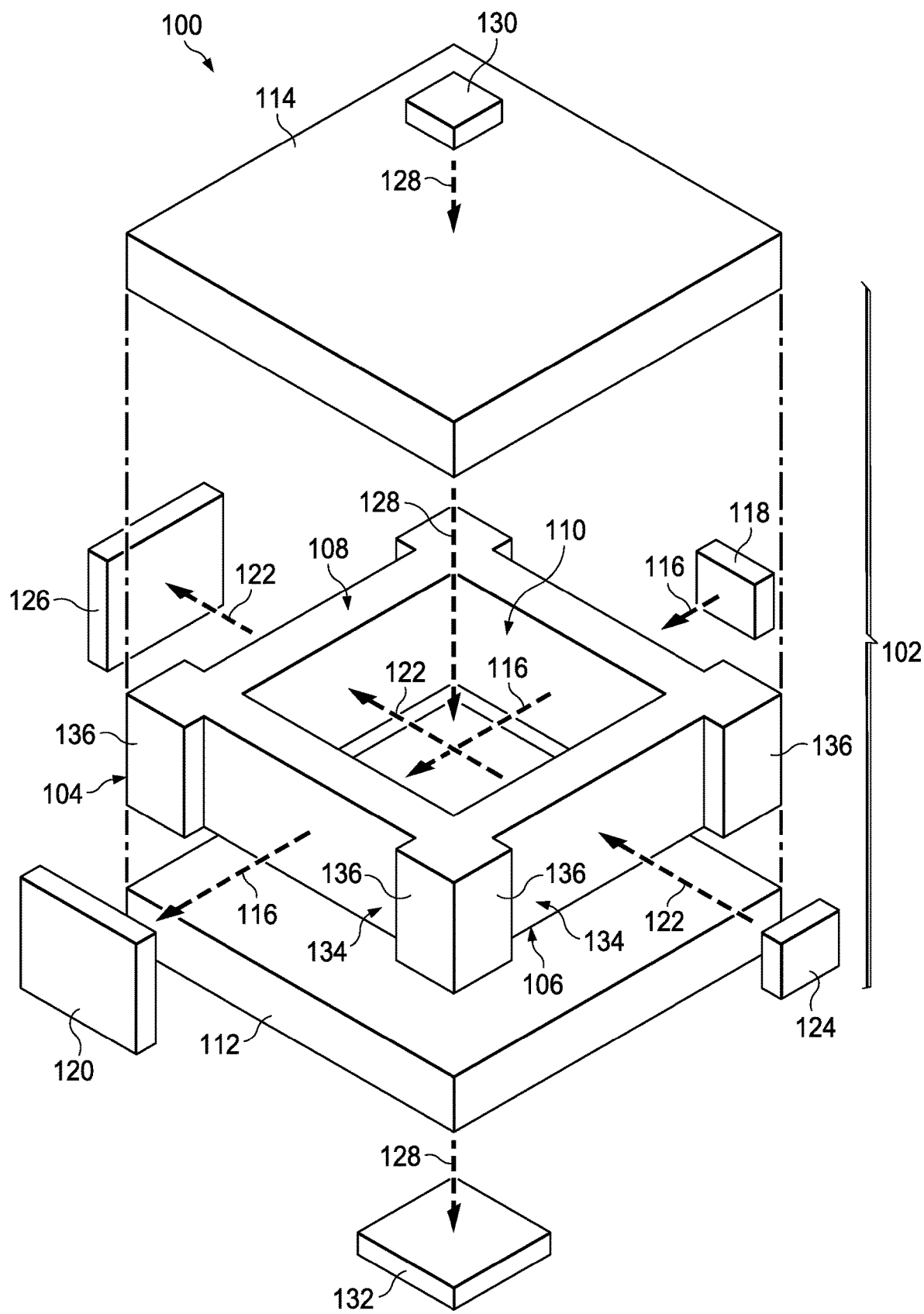
FIG. 1 depicts an example integrated microfabricated vapor cell sensor.

FIG. 1 depicts an example integrated microfabricated vapor cell sensor. The integrated microfabricated vapor cell sensor 100 includes a sensor cell 102. The sensor cell 102 includes a cell body 104 having a first surface 106, which may be understood as a bottom surface 106, and a second surface 108, which may be understood as a top surface 108, with a cavity 110 extending through the cell body 104. A height of the cell body 104, that is, a vertical distance from the first surface 106 to the second surface 108, may be about 0.3 millimeters to about 5 millimeters, to provide a desired form factor for the integrated microfabricated vapor cell sensor 100. Lateral dimensions of the cell body 104, perpendicular to the height, may be about 3 millimeters to about 10 millimeters, again to provide the desired form factor. The sensor cell 102 includes a first plate 112 attached to the cell body 104 at the first surface 106, extending across the cavity 110. The sensor cell 102 further includes a second plate 114 attached to the cell body 104 at the second surface 108, extending across the cavity 110. The first plate 112 and the second plate 114 may have thicknesses of about 0.3 millimeters to about 1 millimeter, to further attain the desired form factor. Sensor fluid material, not shown, is disposed in the cavity 110. The sensor fluid material may include an alkali metal such as cesium or rubidium. Other materials in the sensor fluid material are within the scope of the instant example. The sensor fluid material may be in a vapor phase, for example during operation of the integrated microfabricated vapor cell sensor 100. Alternatively, the sensor fluid material may be in a condensed phase, such as solid alkali metal or a molecular compound of alkali metal such as cesium azide ($CsN_3$).

The cell body 104 includes a transparent material suitable for transmission of signals through the cavity 110. The transparent material may include glass such as borosilicate glass, fused quartz, photosensitive glass, sapphire, organic polymer such as polycarbonate, silicone polymer, or such. Polycarbonate and silicone may provide suitable material for the cell body 104 with an alkali metal diffusion barrier on surfaces exposed to the cavity 110. Layers of materials such as zirconium oxide and tantalum oxide, formed by atomic layer deposition (ALD) processes have been demonstrated to provide barriers to alkali metal diffusion. The first plate 112 may be transparent to the signals, and so may include one or more of the transparent materials disclosed for the cell body 104. Alternatively, the first plate 112 may include silicon or the like, and may not be conducive to signal propagation through the first plate 112. Similarly, the second plate 114 may include one or more transparent materials, or may include non-transmissive material.

A first signal path 116 extends from a first signal emitter 118, through the cell body 104, through the cavity 110, through the cell body 104 again, and to a first signal detector 120. The first signal emitter 118 may be, for example, a visible light source such as a laser, possibly a vertical cavity surface emitting laser (VCSEL), or a light emitting diode (LED). The first signal detector 120 may be, for example, a silicon photodiode. The first signal emitter 118 and the first signal detector 120 are located within 10 millimeters of the cell body 104, to provide the desired form factor. In the instant example, a second signal path 122 extends from a second signal emitter 124, through the cell body 104, through the cavity 110, through the cell body 104 again, and to a second signal detector 126. The second signal path 122 intersects the first signal path 116 in the cavity 110, possibly perpendicularly. In manifestations of the instant example wherein the first plate 112 and the second plate 114 are transparent to signals, an optional third signal path 128 may extend from a third signal emitter 130 through the second plate 114, through the cavity 110, through the first plate 112, and to a third signal detector 132. The third signal path 128 intersects the first signal path 116 in the cavity 110, and may optionally intersect the second signal path 122 in the cavity 110. In some manifestations of the instant example having the third signal emitter 130 and the third signal detector 132, the second signal emitter 124 and the second signal detector 126 may be omitted.

An exterior surface 134 of the cell body 104 may be recessed at locations where the first signal path 116 and the second signal path 122 intersect the cell body 104, away from singulated areas 136 on the exterior surface 134. The singulated areas 136 may be rough and hence unsuitable for transmission of signals through the cell body 104. The singulated areas 136 result from a singulation process such as sawing used to separate the cell body 104 from a body wafer.

Having two or three signal paths through the cavity 110 may advantageously provide more sensitivity during operation of the integrated microfabricated vapor cell sensor 100, compared to a similar microfabricated vapor cell sensor having only one signal path. For example, when used as an atomic clock, having two or three signal paths through the cavity 110 may enable more accurate clock frequency determination in the presence of an external magnetic field. When used as an atomic magnetometer, having two or three signal paths through the cavity 110 may enable more accurate measurement of the magnitude and direction of the external magnetic field.

Figure 2A:
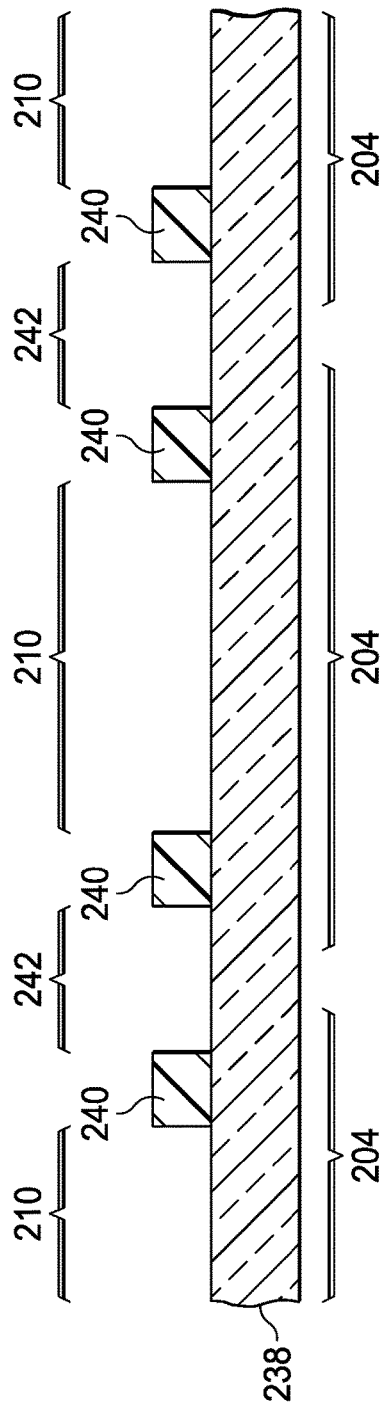
FIG. 2A through FIG. 2G depict a sensor cell, similar to that described in reference to FIG. 1, in successive stages of an example method of formation.

FIG. 2A through FIG. 2G depict a sensor cell, similar to that described in reference to FIG. 1, in successive stages of an example method of formation. Referring to FIG. 2A, a body wafer 238 has areas for multiple cell bodies 204. The body wafer 238 includes transparent material such as glass or sapphire. The body wafer 238 may have a homogeneous structure or may have a layered structure to provide bondability to first and second wafers in subsequent operations. The body wafer 238 may be about 0.3 millimeters to about 5 millimeters thick.

An etch mask 240 is formed over the body wafer 238, exposing areas for cavities 210 of the cell bodies 204, and optionally exposing recess areas 242 between the areas for the cavities 210. The etch mask 240 may include hard mask material such as silicon nitride, silicon carbide, or such.

Figure 2B:
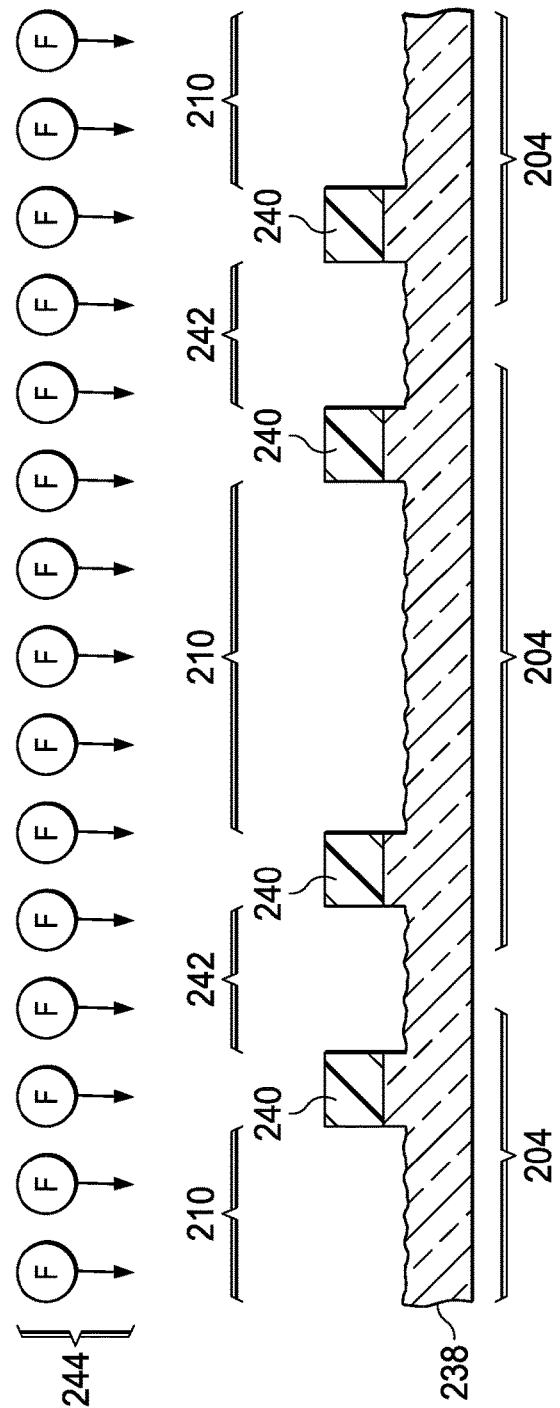

Referring to FIG. 2B, a first step of a two-step deep reactive ion etch (DRIE) process removes material from the body wafer 238 where exposed by the etch mask 240. The two-step DRIE process is sometimes referred to as the Bosch etch process. The first step of the two-step DRIE process may use halogen radicals 244, depicted in FIG. 2B as fluorine radicals. The first step etches partway through the body wafer 238.

Figure 2C:
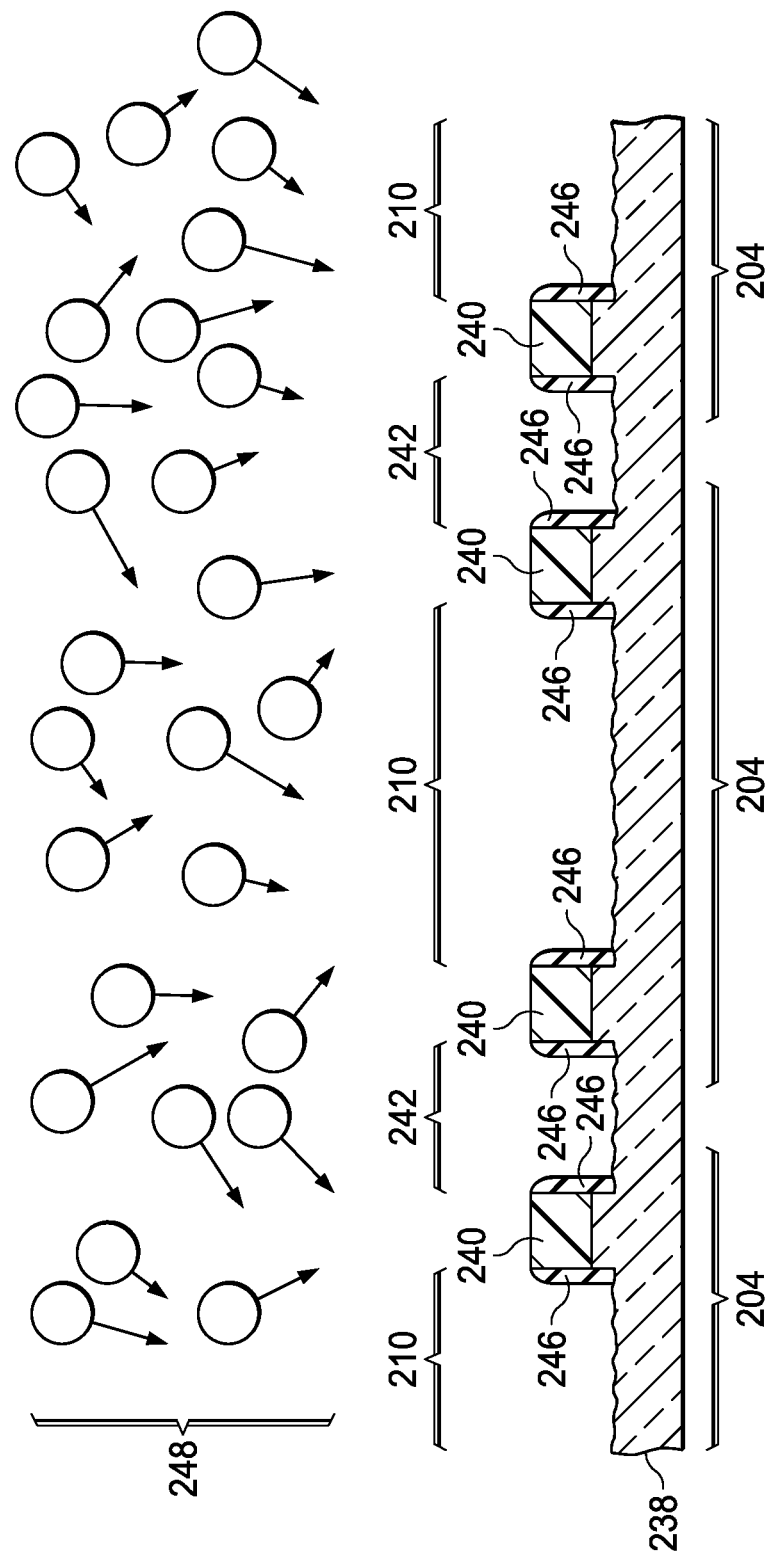

Referring to FIG. 2C, a second step of the two-step DRIE process forms a passivation layer 246 on sidewalls of the etched areas of the body wafer 238. The passivation layer 246 may include organic polymers formed by reaction of hydrocarbons 248 in a plasma above the body wafer 238. The passivation layer 246 protects the sidewalls from lateral etching during repetitions of the first step of the DRIE process as described in reference to FIG. 2B. The first step and the second step of the two step DRIE process are repeated in sequence until the cavities 210 extend through the body wafer 238. The recesses 242 also extend through the body wafer 238 when the two step DRIE process is completed.

Alternatively, a continuous DRIE process may be used to form the cavities 210 and the recesses 242. In the continuous DRIE process, hydrocarbons and halogen radicals are used together to concurrently remove material from a bottom portion of the etched areas of the body wafer 238 while forming the passivation layer 246 on the sidewalls of the etched areas.

After the cavities 210 and the recesses 242 are formed, the etch mask 240 is removed. Silicon nitride and silicon carbide in the etch mask 240 may be removed using an aqueous solution of phosphoric acid. A wet etch in an aqueous mixture of sulfuric acid and hydrogen peroxide or an aqueous mixture of ammonium hydroxide and hydrogen peroxide may be used to removed remaining traces of the passivation layer 246.

Figure 2D:
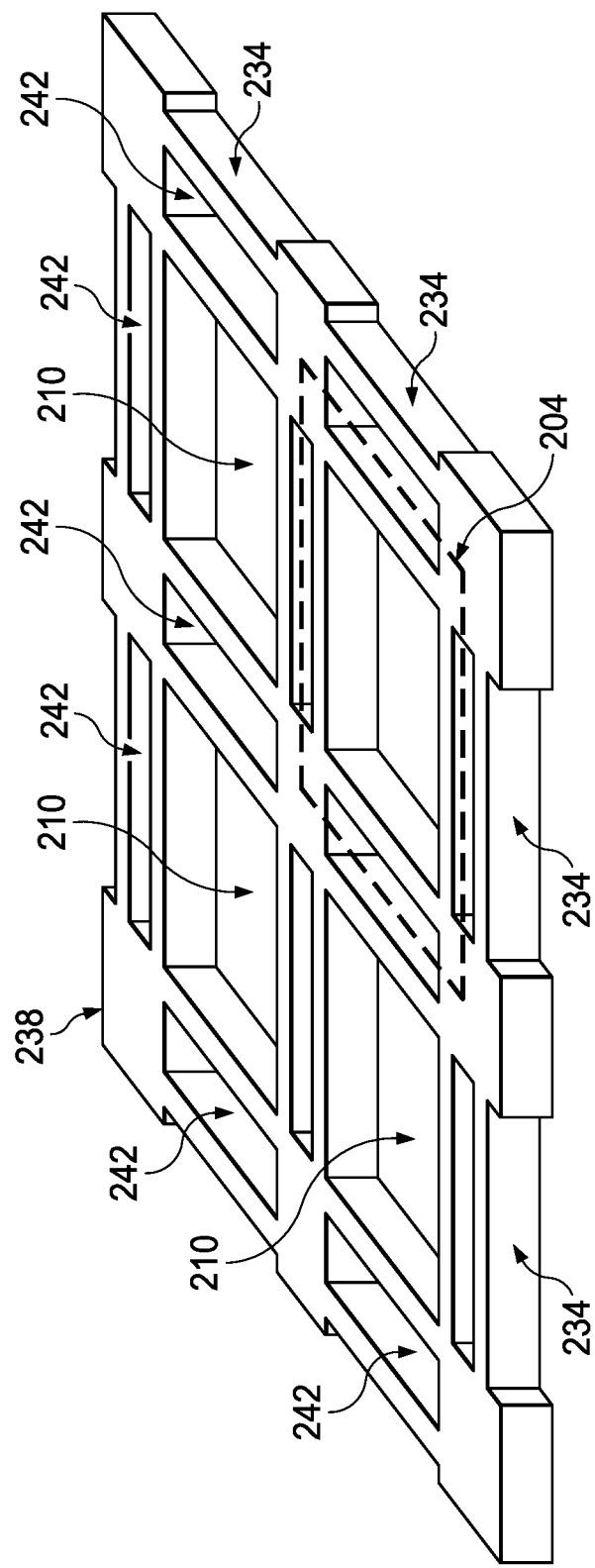

FIG. 2D depicts the body wafer 238 after the etch mask 240 of FIG. 2C is removed. The body wafer 238 is continuous, having multiple cavities 210 and optionally having multiple recesses 242. The cavities 210 extend through the body wafer 238. The optional recesses 242 may also extend through the body wafer 238. Each area for the cell bodies 204 extends past the corresponding cavity 210 and partway into the adjacent recesses 242. Sidewalls 234 of the cell bodies 204 may be substantially vertical, that is, within a few degrees of perpendicular to a second surface of the body wafer 238, in the instant example.

Figure 2E:
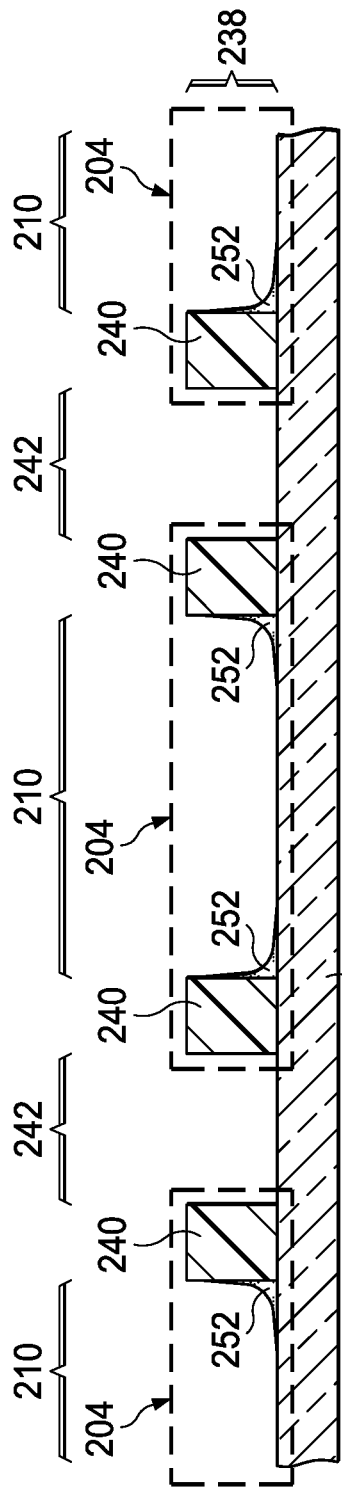

Referring to FIG. 2E, a first wafer 250 is attached to the body wafer 238, extending across the cavities 210. The first wafer 250 may be attached by an anodic bonding process, use of adhesives, soldering, welding, or other process. The first wafer 250 may be transparent to signals used in the integrated microfabricated vapor cell sensor, or may be non-transmissive.

Sensor fluid material 252 may be disposed in the cavities 210 at this time. The sensor fluid material may be in the form of liquid or solid alkali metal, or may be a molecular compound of an alkali metal, such as cesium azide.

Figure 2F:
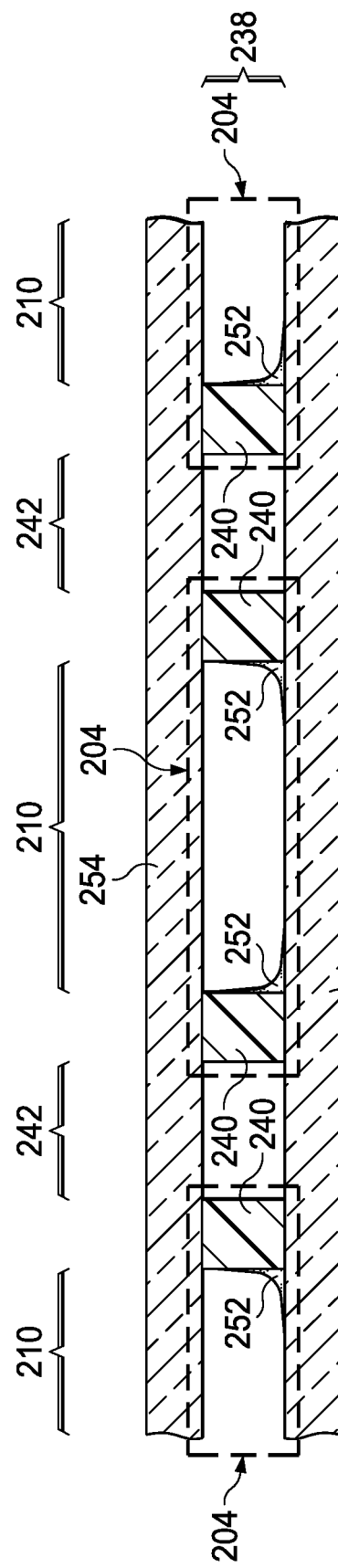

Referring to FIG. 2F, a second wafer 254 is attached to the body wafer 238 opposite from the first wafer 250. The second wafer 254 may have a composition and structure similar to that of the first wafer 250. The second wafer 254 may be attached to the body wafer 238 using a similar process to the process used to attach the first wafer 250.

Figure 2G:
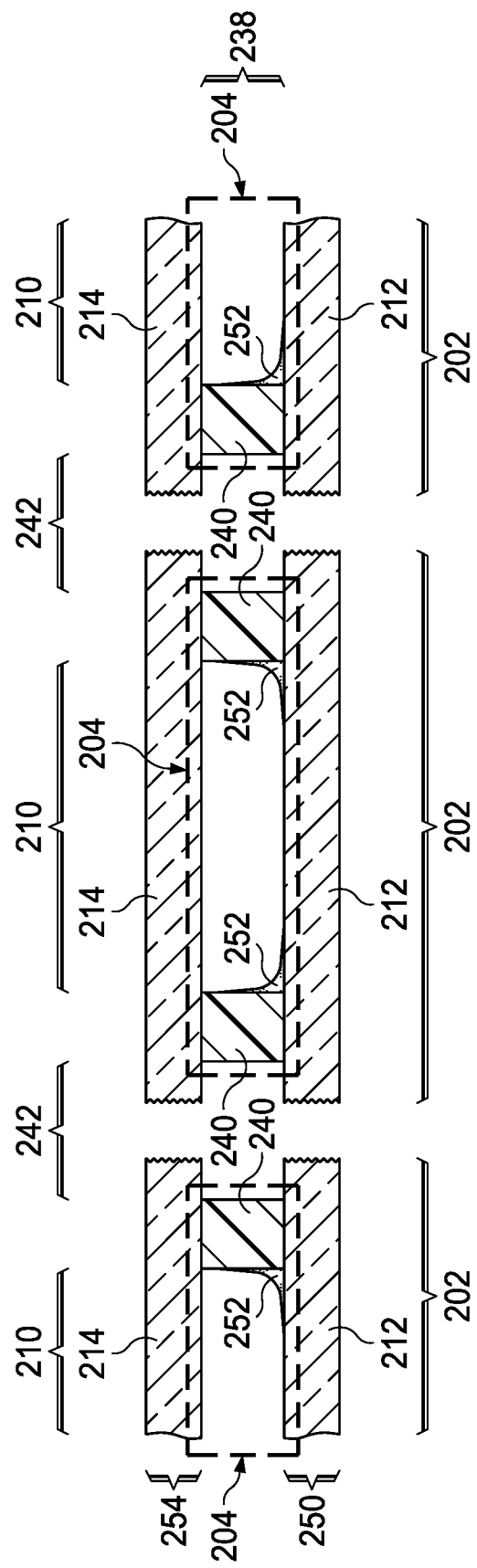

Referring to FIG. 2G, the body wafer 238, the first wafer 250, and the second wafer 254 are singulated, for example by sawing, mechanical scribing, or laser scribing, to form separate sensor cells 202. The body wafer 238 provides the cell bodies 204 of the sensor cells 202. In one version of the instant example, the first wafer 250 provides first plates 212 of the sensor cells 202, and the second wafer 254 provides second plates 214 of the sensor cells 202. In an alternate version, the first wafer 250 provides the second plates 214, and the second wafer 254 provides the first plates 212. The recesses 242 keep surfaces of the cell bodies 204 from being degraded by the singulation process.

The sensor cells 202 are integrated into corresponding integrated microfabricated vapor cell sensors. Signal emitters and signal detectors of each integrated microfabricated vapor cell sensor are assembled proximate to the corresponding sensor cells 202, that is, within 10 millimeters of the corresponding cell bodies 204. At least one signal path of each integrated microfabricated vapor cell sensor extends through the cell body 204, for example as described in reference to FIG. 1.

Figure 3C:
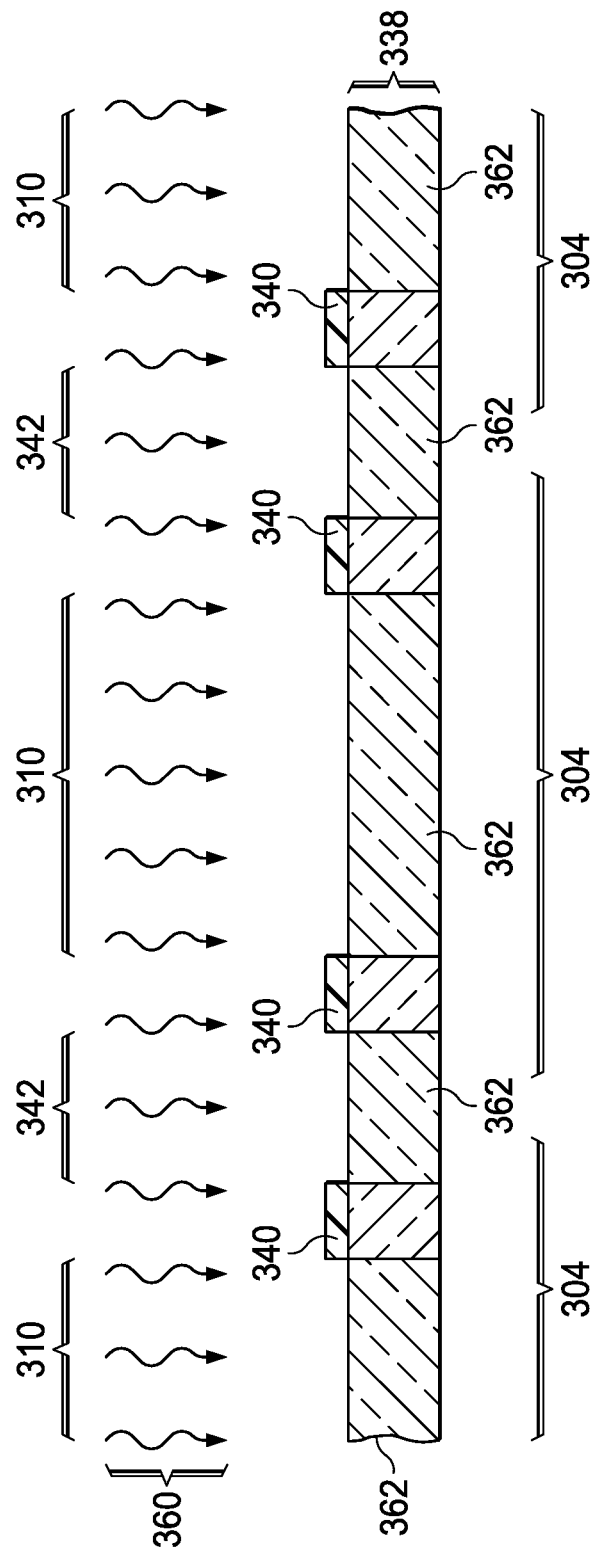

FIG. 3A through FIG. 3E depict a sensor cell, similar to that described in reference to FIG. 1, in successive stages of another example method of formation. Referring to FIG. 3A, a body wafer 338 has areas for multiple cell bodies 304. The body wafer 338 includes photosensitive glass. An exposure mask 340 is formed over the body wafer 338, exposing areas for cavities 310 of the cell bodies 304, and optionally exposing recess areas 342 between the areas for the cavities 310. The exposure mask 340 may include material that is opaque to ultraviolet light, such as metal or ultraviolet-absorbing polymer. The exposure mask 340 may be formed by depositing a layer of metal on the body wafer 338 and patterning the layer of metal with an etch process using a photolithographically-defined mask. The exposure mask 340 may be formed by screen printing or ink jet printing an ultraviolet-absorbing polymer or ultraviolet-absorbing ink.

Referring to FIG. 3B, the body wafer 338 is exposed to ultraviolet light 356 where exposed by the exposure mask 340. The ultraviolet light 356 changes oxidation states of metals in the photosensitive glass in the body wafer 338 where exposed by the exposure mask 340 to form exposed regions 358 in the body wafer 338 in the areas for the cavities 310 and the areas for the recesses 342.

Referring to FIG. 3C, the body wafer 338 is heated by a tempering process 360 to convert the exposed regions 358 of FIG. 3B to polycrystalline regions 362, sometimes referred to as ceramic regions. Conversion of the exposed regions 358 to the polycrystalline regions 362 may occur at a temperature of 450° C. to 600° C. The tempering process 360 may be a radiant heat process as indicated in FIG. 3C, may be a furnace process, may be a hot plate process, or may be another heating process.

Figure 3D:
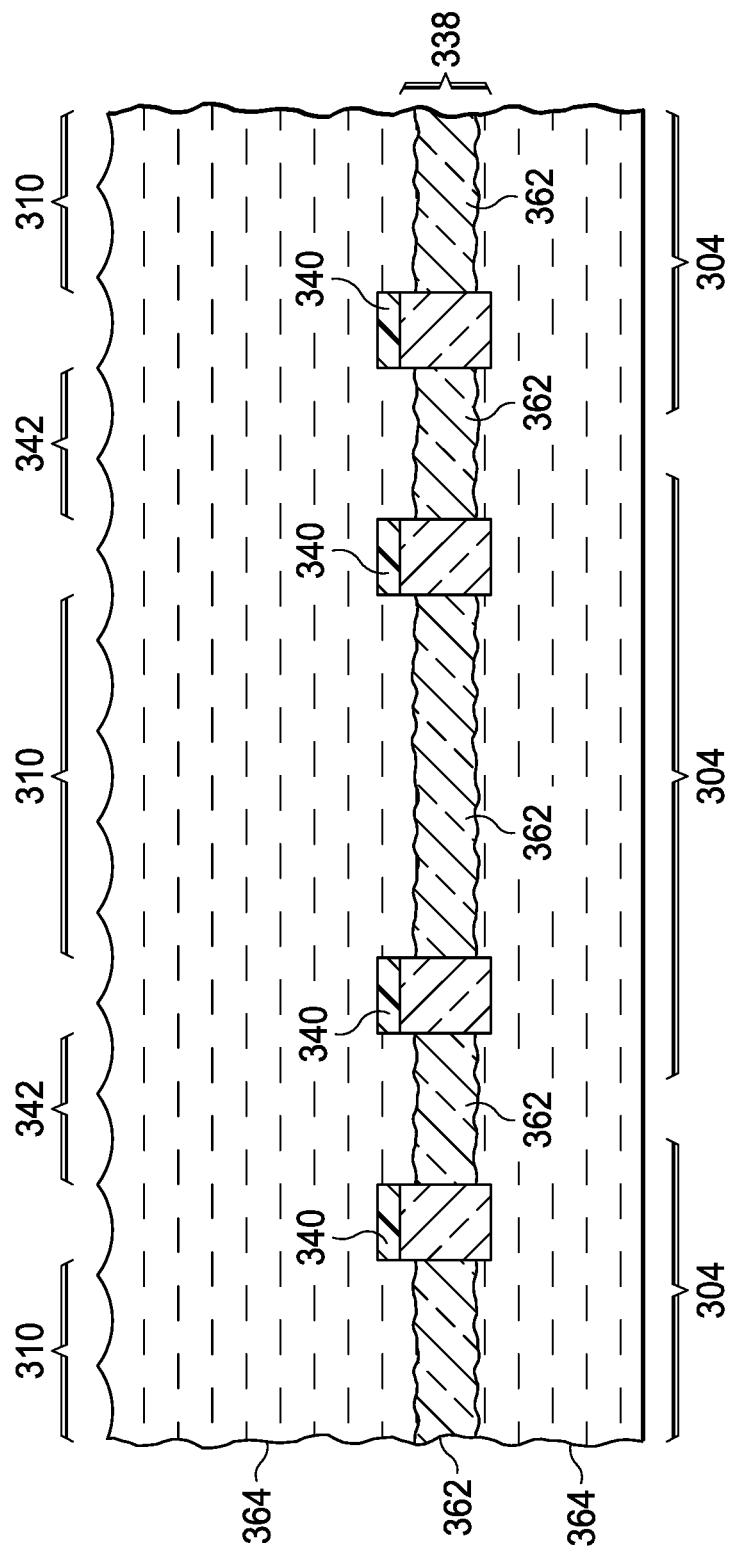

Referring to FIG. 3D, the polycrystalline regions 362 of the body wafer 338 are removed by a wet etch process 364, for example, a dilute aqueous solution of hydrofluoric acid. Regions of the body wafer 338 which were not exposed to the ultraviolet light 356 of FIG. 3B have a lower etch rate in the wet etch process 364 than the polycrystalline regions 362. FIG. 3D shows the wet etch process 364 partway to completion. The exposure mask 340 may be left in place during the wet etch process 364, as indicated in FIG. 3D, or may be removed prior to the wet etch process 364. The exposure mask 340 may be removed during the wet etch process 364, or may be removed after the wet etch process 364 is completed.

Figure 3E:
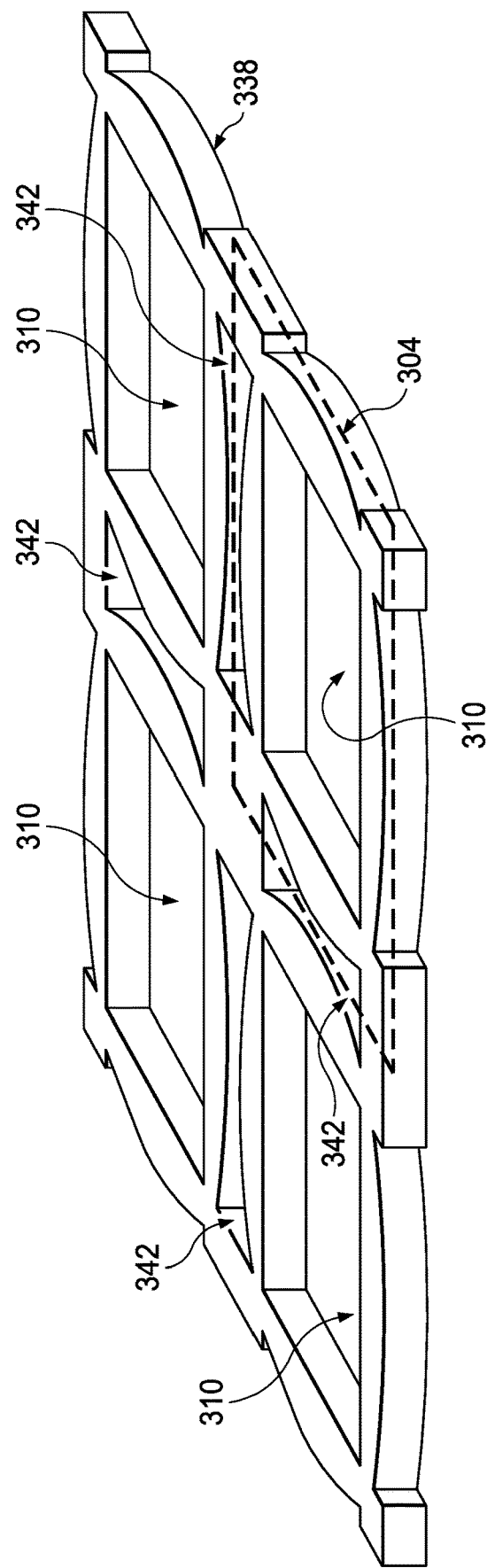

FIG. 3E shows the body wafer 338 after the wet etch process 364 of FIG. 3D is completed. The cavities 310 extend through the body wafer 338. In the instant example, the recesses 342 have curved boundaries to provide convex lateral profiles for sidewalls of each cell body 304. During operation of integrated microfabricated vapor cell sensors containing the cell bodies 304, the convex lateral profiles may reduce divergence of input signals through the cavities 310, advantageously increasing output signals from the cavities 310.

Figure 4A:
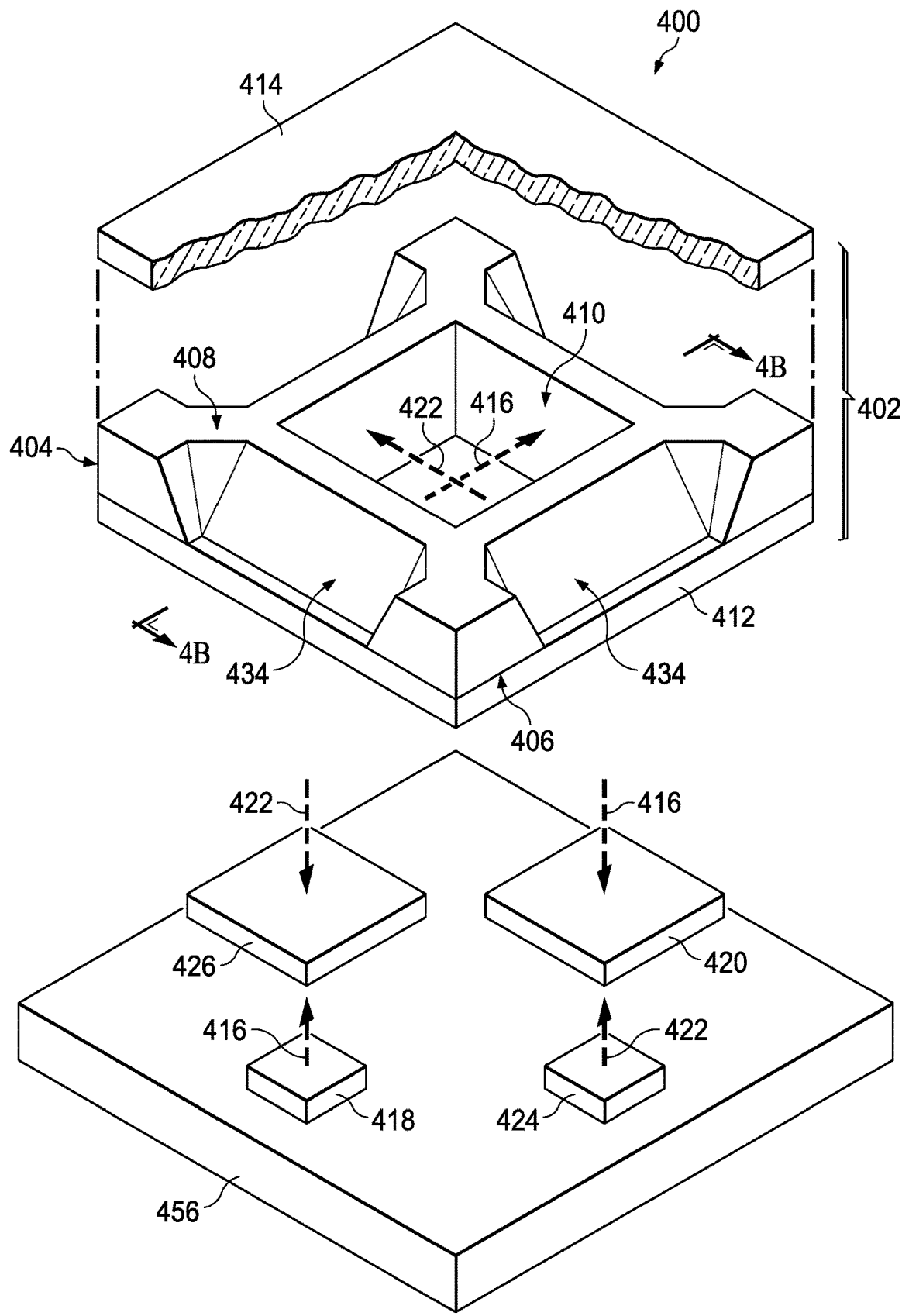
FIG. 4A and FIG. 4B depict another example integrated microfabricated vapor cell sensor.
Figure 4B:
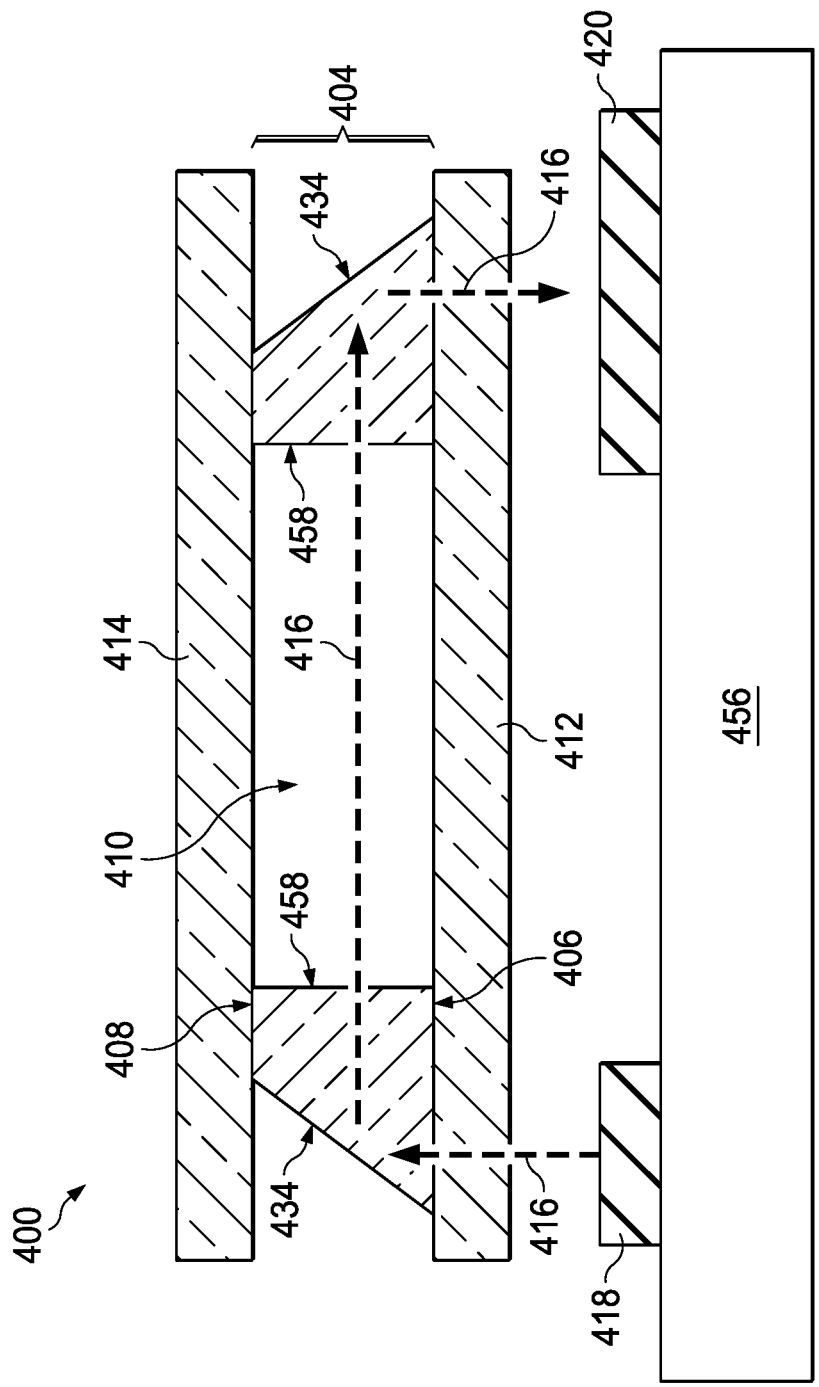

FIG. 4A and FIG. 4B depict another example integrated microfabricated vapor cell sensor. Referring to FIG. 4A, the integrated microfabricated vapor cell sensor 400 includes a sensor cell 402. The sensor cell 402 includes a cell body 404 having a first surface 406 and a second surface 408, with a cavity 410 extending through the cell body 404. A height of the cell body 404 may be about 0.3 millimeters to about 5 millimeters. Lateral dimensions of the cell body 404 may be about 3 millimeters to about 10 millimeters. The sensor cell 402 includes a first plate 412 attached to the cell body 404 at the first surface 406, extending across the cavity 410. The sensor cell 402 further includes a second plate 414 attached to the cell body 404 at the second surface 408, extending across the cavity 410. The first plate 412 and the second plate 414 may have thicknesses of about 0.3 millimeters to about 1 millimeter. Sensor fluid material, not shown, is disposed in the cavity 410.

The cell body 404 includes a transparent material suitable for transmission of signals through the cavity 410. The transparent material may include borosilicate glass, fused quartz, photosensitive glass, sapphire, polycarbonate, silicone, or such. In the instant example, the first plate 412 is transparent to the signals, and so may include one or more of the transparent materials disclosed for the cell body 404. The second plate 414 may include one or more transparent materials, or may include non-transmissive material.

A first signal path 416 extends from a first signal emitter 418, through the first plate 412, through the cell body 404 and reflecting off an exterior surface 434 of the cell body 404, through the cavity 410, through the cell body 404 and reflecting off the exterior surface 434 again, through the first plate 412 again, and to a first signal detector 420. A second signal path 422 extends from a second signal emitter 424, through the first plate 412, through the cell body 404 and reflecting off the exterior surface 434 of the cell body 404, through the cavity 410, through the cell body 404 and reflecting off the exterior surface 434 again, through the first plate 412 again, and to a second signal detector 426. The second signal path 422 intersects the first signal path 416 in the cavity 410, possibly perpendicularly. The first signal emitter 418, the first signal detector 420, the second signal emitter 424, and the second signal detector 426 are located within 10 millimeters of the cell body 404, for example, mounted on a component substrate 456 of the integrated microfabricated vapor cell sensor 400. Having the first signal emitter 418, the first signal detector 420, the second signal emitter 424, and the second signal detector 426 on the component substrate 456 may reduce a total height of the integrated microfabricated vapor cell sensor 400, and so advantageously attain a desired form factor. Having the first signal emitter 418, the first signal detector 420, the second signal emitter 424, and the second signal detector 426 on the component substrate 456 may facilitate assembly of the integrated microfabricated vapor cell sensor 400, and so advantageously reduce an assembly cost.

FIG. 4B is a cross section of the integrated microfabricated vapor cell sensor 400 along section line 4B-4B of FIG. 4A. In the instant example, the exterior surfaces 434 of the cell body 404 in the first signal path 416 are sloped at approximately 45 degrees with respect to the first surface 406 of the cell body 404. Interior surfaces 458 of the cell body 404 in the first signal path 416 are oriented at approximately 90 degrees with respect to the first surface 406. The interior surfaces 458 are exposed to the cavity 410.

During operation of the integrated microfabricated vapor cell sensor 400, an input signal from the first signal emitter 418 passes through the first plate 412 along the first signal path 416 into the cell body 404, is reflected off the exterior surface 434, and passes into the cavity 410. An output signal from the cavity 410 passes into the cell body 404 along the first signal path 416, is reflected off the exterior surface 434, and passes through the first plate 412 to the first signal detector 420.

Figure 5A:
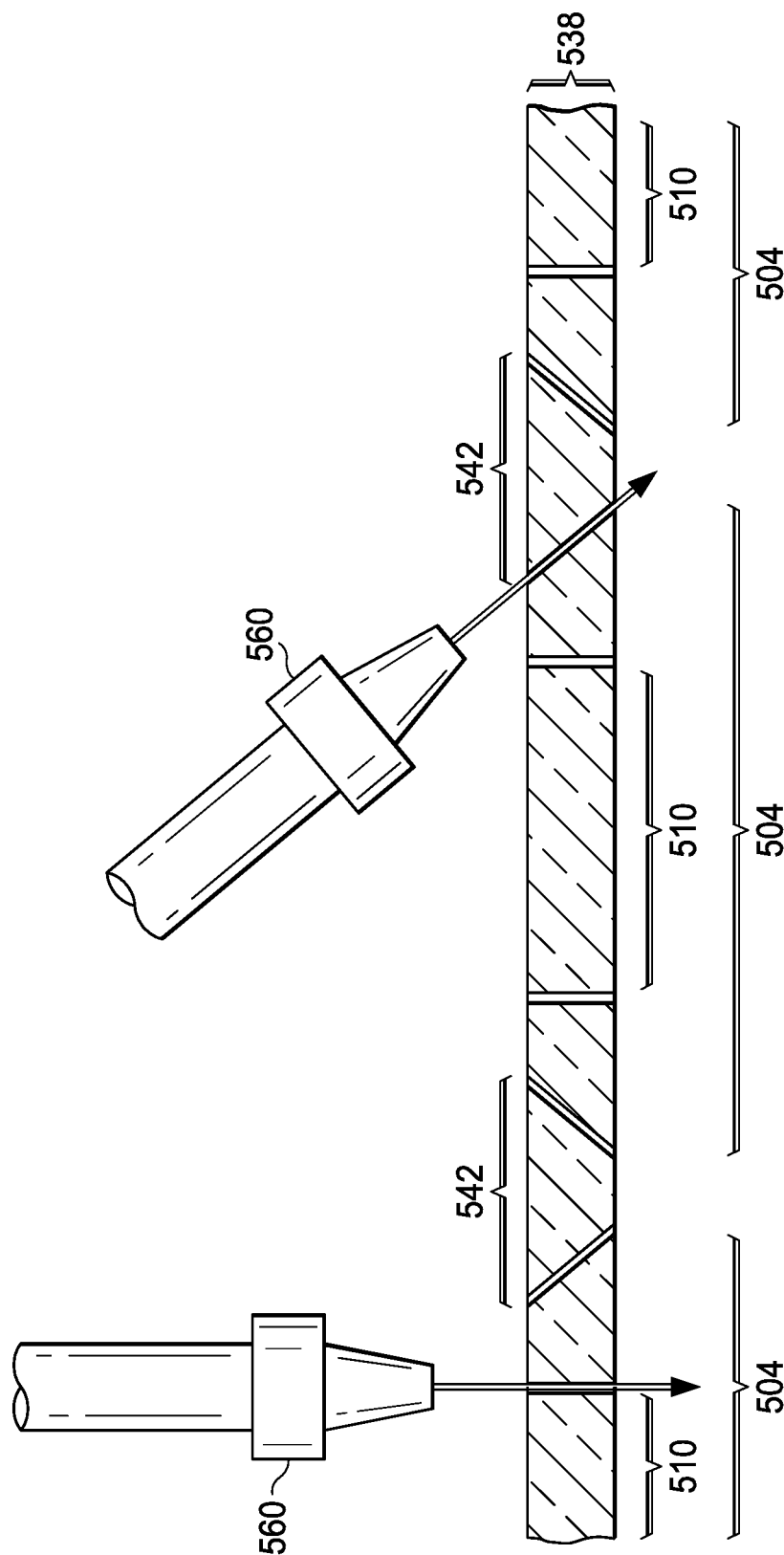
FIG. 5A and FIG. 5B depict a sensor cell, similar to that described in reference to FIG. 4A and FIG. 4B, in successive stages of an example method of formation.
Figure 5B:
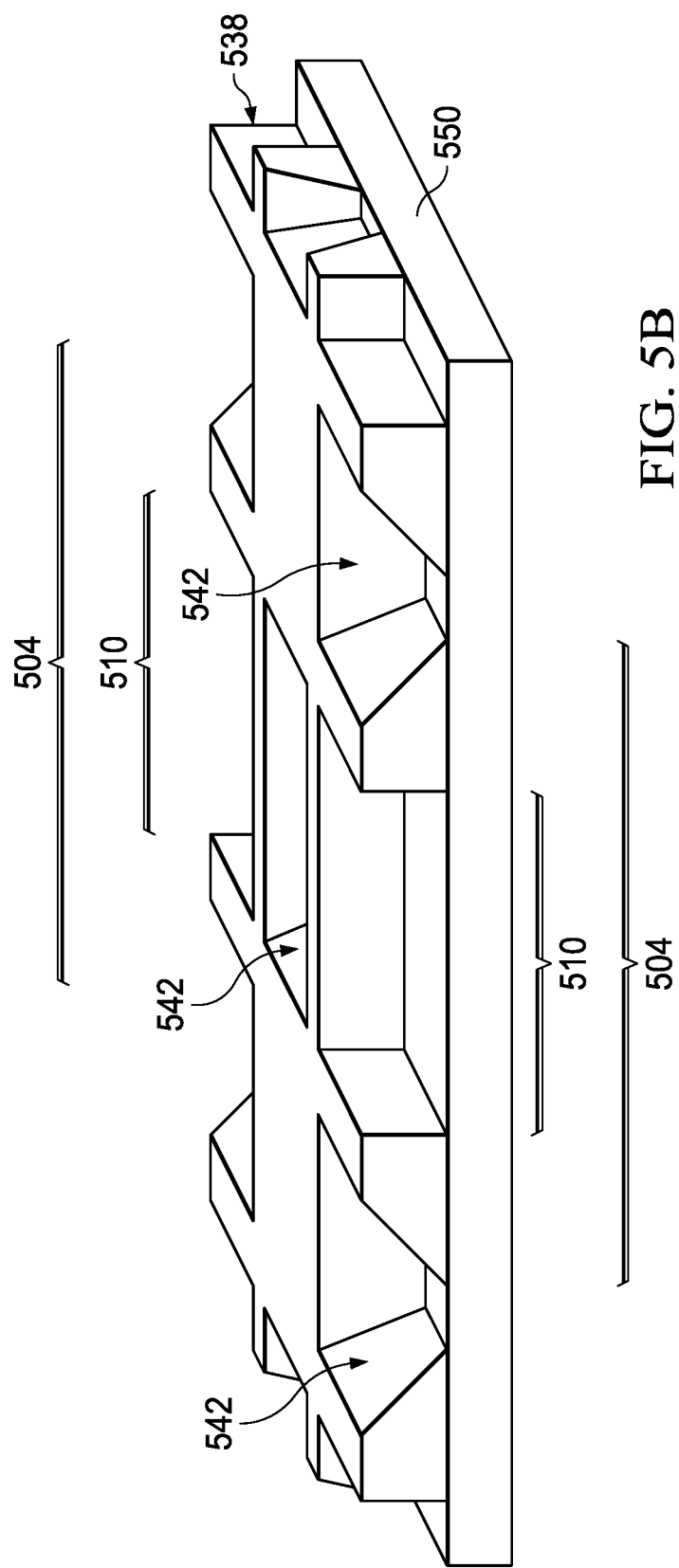

FIG. 5A and FIG. 5B depict a sensor cell, similar to that described in reference to FIG. 4A and FIG. 4B, in successive stages of an example method of formation. Referring to FIG. 5A, a body wafer 538 has areas for multiple cell bodies 504 with areas for recesses 542 between the areas for the cell bodies 504. The body wafer 538 includes transparent material such as glass, sapphire, organic polymer, or silicone polymer. The body wafer 538 may have a homogeneous structure or may have a layered structure. The body wafer 538 may be about 0.3 millimeters to about 5 millimeters thick.

Unwanted material of the body wafer 538 is removed by a fluid jet system 560, depicted in FIG. 5A as a three-axis abrasive water jet system 560. The fluid jet system 560 may cut through the body wafer 538 at a desired angle around boundaries of cavities 510 in the cell bodies 504, and around boundaries of the recesses 542.

Referring to FIG. 5B, a first wafer 550 is attached to the body wafer 538, for example as described in reference to FIG. 2E. Sensor fluid material, not shown in FIG. 5B, is subsequently disposed into the cavities 510. A second wafer, also not shown in FIG. 5B, is attached to the body wafer 538 opposite from the first wafer 550, for example as described in reference to FIG. 2F. The body wafer 538, the first wafer 550, and the second wafer are singulated to form sensor cells. The sensor cells are assembled into integrated microfabricated vapor cell sensors, similar to that shown in FIG. 4A and FIG. 4B.

Figure 6A:
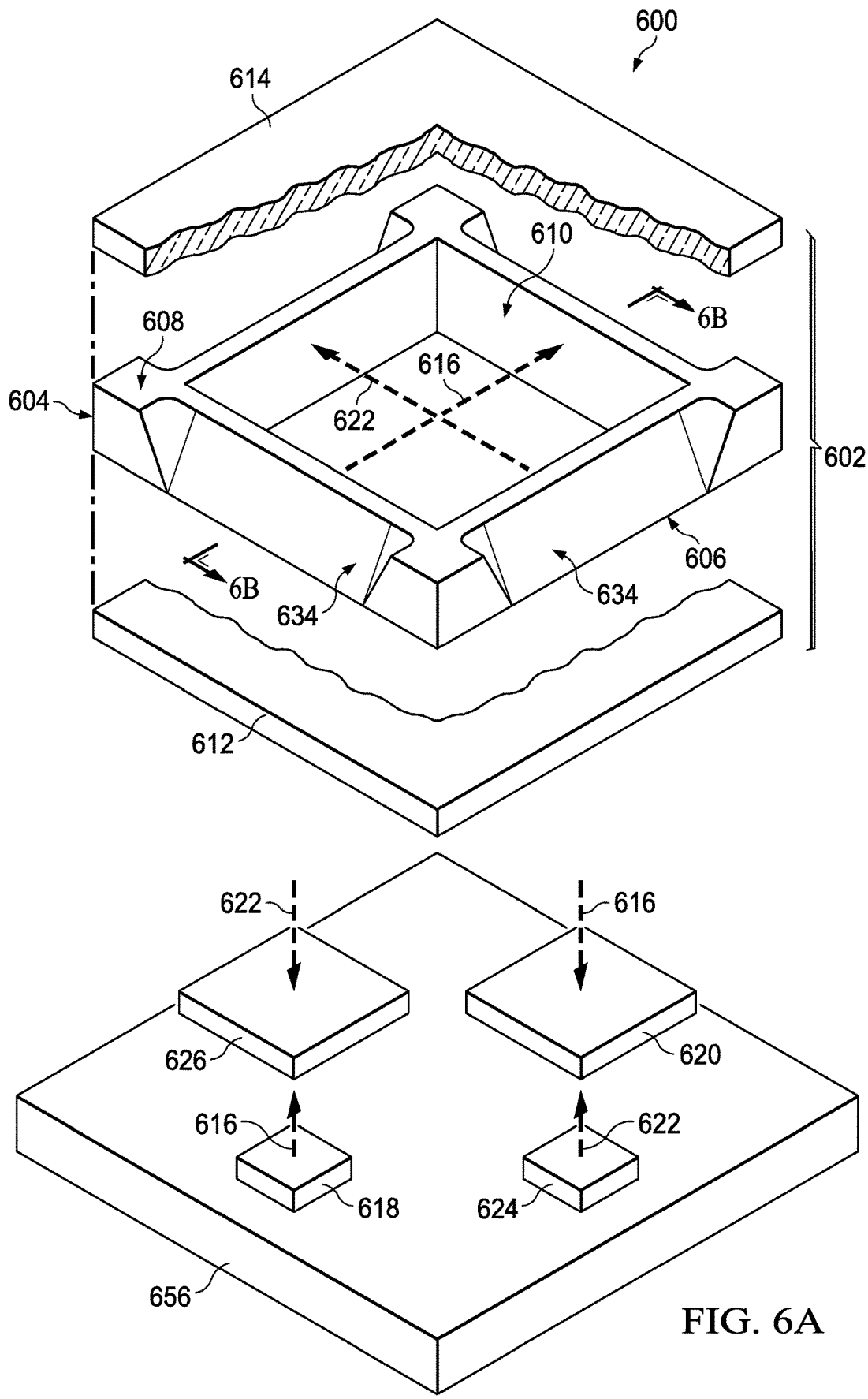
FIG. 6A and FIG. 6B depict another example integrated microfabricated vapor cell sensor.
Figure 6B:
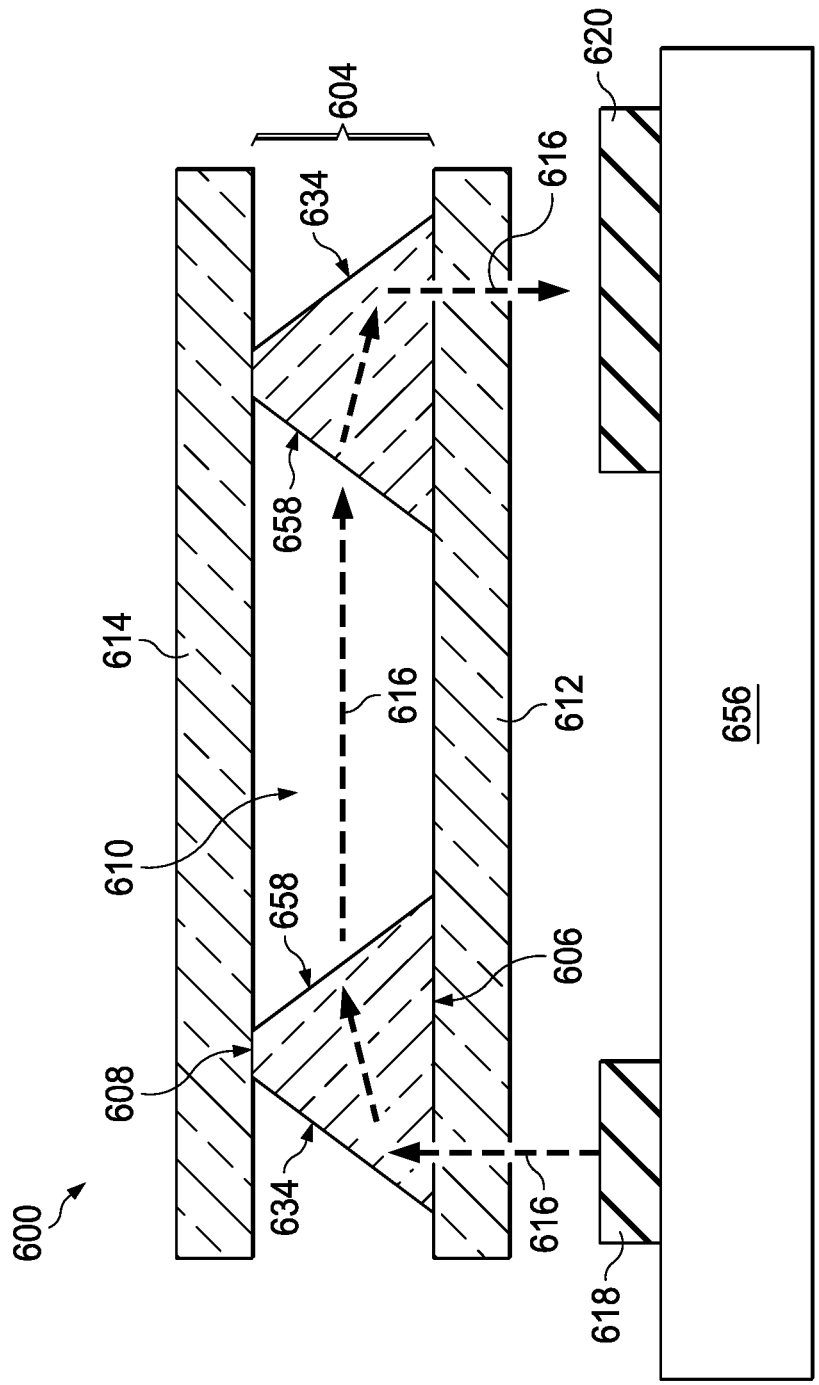

FIG. 6A and FIG. 6B depict another example integrated microfabricated vapor cell sensor. Referring to FIG. 6A, the integrated microfabricated vapor cell sensor 600 includes a sensor cell 602 with a cell body 604 having a first surface 606 and a second surface 608, and a cavity 610 extending through the cell body 604. A height of the cell body 604 may be about 0.3 millimeters to about 5 millimeters. Lateral dimensions of the cell body 604 may be about 3 millimeters to about 10 millimeters. The sensor cell 602 includes a first plate 612 attached to the cell body 604 at the first surface 606, extending across the cavity 610. The sensor cell 602 further includes a second plate 614 attached to the cell body 604 at the second surface 608, extending across the cavity 610. Sensor fluid material, not shown, is disposed in the cavity 610. The cell body 604 includes a transparent material suitable for transmission of signals through the cavity 610. In the instant example, the first plate 612 is transparent to the signals. The second plate 614 may be transparent or non-transmissive.

A first signal path 616 extends from a first signal emitter 618, through the first plate 612, through the cell body 604 and reflecting off an exterior surface 634 of the cell body 604, through the cavity 610, through the cell body 604 and reflecting off the exterior surface 634 again, through the first plate 612 again, and to a first signal detector 620. A second signal path 622 follows a similar path from a second signal emitter 624 to a second signal detector 626. The second signal path 622 intersects the first signal path 616 in the cavity 610, possibly perpendicularly. The first signal emitter 618, the first signal detector 620, the second signal emitter 624, and the second signal detector 626 are located within 10 millimeters of the cell body 604, for example, mounted on a component substrate 656 of the integrated microfabricated vapor cell sensor 600.

FIG. 6B is a cross section of the integrated microfabricated vapor cell sensor 600 along section line 6B-6B of FIG. 6A. In the instant example, the exterior surfaces 634 of the cell body 604 and interior surfaces 658 in the first signal path 616 are sloped at approximately a same angle, between 45 degrees and 60 degrees, with respect to the first surface 606 of the cell body 604. The interior surfaces 658 are exposed to the cavity 610. During operation of the integrated microfabricated vapor cell sensor 600, an input signal from the first signal emitter 618 passes through the first plate 612 along the first signal path 616 into the cell body 604, is reflected off the exterior surface 634, and passes into the cavity 610. An output signal from the cavity 610 passes into the cell body 604 along the first signal path 616, is reflected off the exterior surface 634, and passes through the first plate 612 to the first signal detector 620. The angle of the exterior surfaces 634 and the interior surfaces 658, with respect to the first surface 606, is selected so that the input signal enters the cavity 610 approximately parallel to the first surface 606. In one example in which the transparent material in the cell body 604 has an index of refraction of 1.5 at a wavelength of the input signal, an angle of 51.9 degrees will provide the desired direction of the input signal in the cavity 610. Configuring the cell body 604 to direct the input signal in the cavity 610 parallel to the first surface 606 may advantageously enable a desired length of the first signal path 616 through the cavity 610 without loss of the input signal into the second plate 614 or the first plate 612.

Figure 7C:
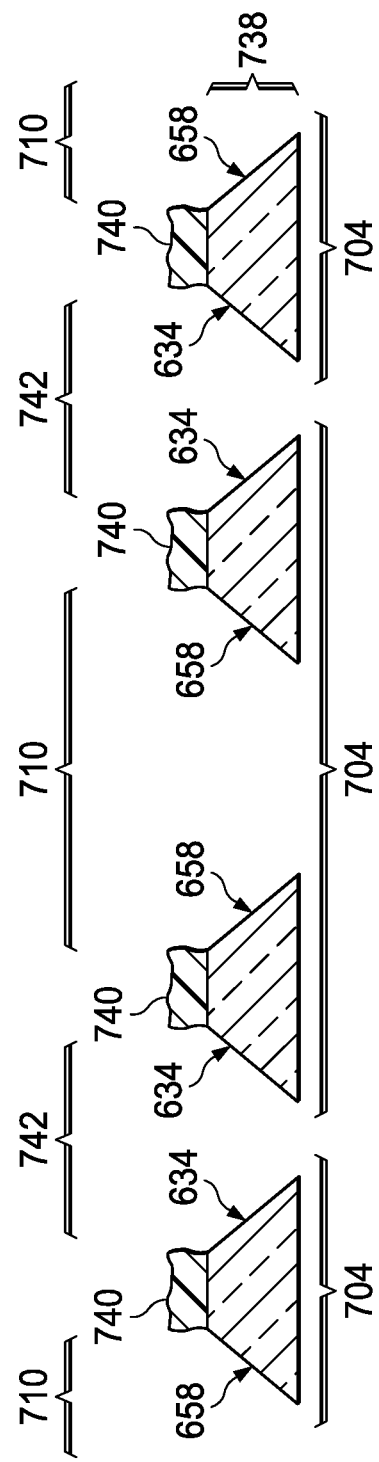

FIG. 7A through FIG. 7C depict a sensor cell, similar to that described in reference to FIG. 6A and FIG. 6B, in successive stages of an example method of formation. Referring to FIG. 7A, a body wafer 738 has areas for multiple cell bodies 704. The body wafer 738 includes transparent material. The body wafer 738 may have a homogeneous structure or may have a layered structure, and may be about 0.3 millimeters to about 5 millimeters thick. An erodable etch mask 740 is formed over the body wafer 738, exposing areas for cavities 710 of the cell bodies 704, and exposing recess areas 742 between the areas for the cavities 710. The erodable etch mask 740 may include photoresist and possibly other organic material, such as a first anti-reflection coat (BARC).

Referring to FIG. 7B, a reactive ion etch (RIE) process removes material from the body wafer 738 where exposed by the erodible etch mask 740. The RIE process may use halogen radicals 744, depicted in FIG. 7B as fluorine radicals. The RIE process also removes material from the erodible etch mask 740, so that lateral boundaries of the erodible etch mask 740 recede during the RIE process, exposing new areas of the body wafer 738. The result is to form sloped surfaces in the body wafer 738 at interior surfaces 658 and exterior surfaces 634 of the cell bodies 704. An angle of the sloped surfaces is affected by a vertical rate of removal of the transparent material from the body wafer 738 and a horizontal rate of removal of the material from the erodible etch mask 740. FIG. 7B shows the RIE process partway to completion.

FIG. 7C depicts the body wafer 738 after the RIE process is completed. The recesses 742 also extend through the body wafer 738. The remaining erodible etch mask 740 is removed, for example, using an ash process, a wet etch process including an aqueous mixture of sulfuric acid and hydrogen peroxide, or a wet etch process including an aqueous mixture of ammonium hydroxide and hydrogen peroxide. The body wafer 738 is subsequently processed to form sensor cells, for example as described in reference to FIG. 2E through FIG. 2G.

Figure 8A:
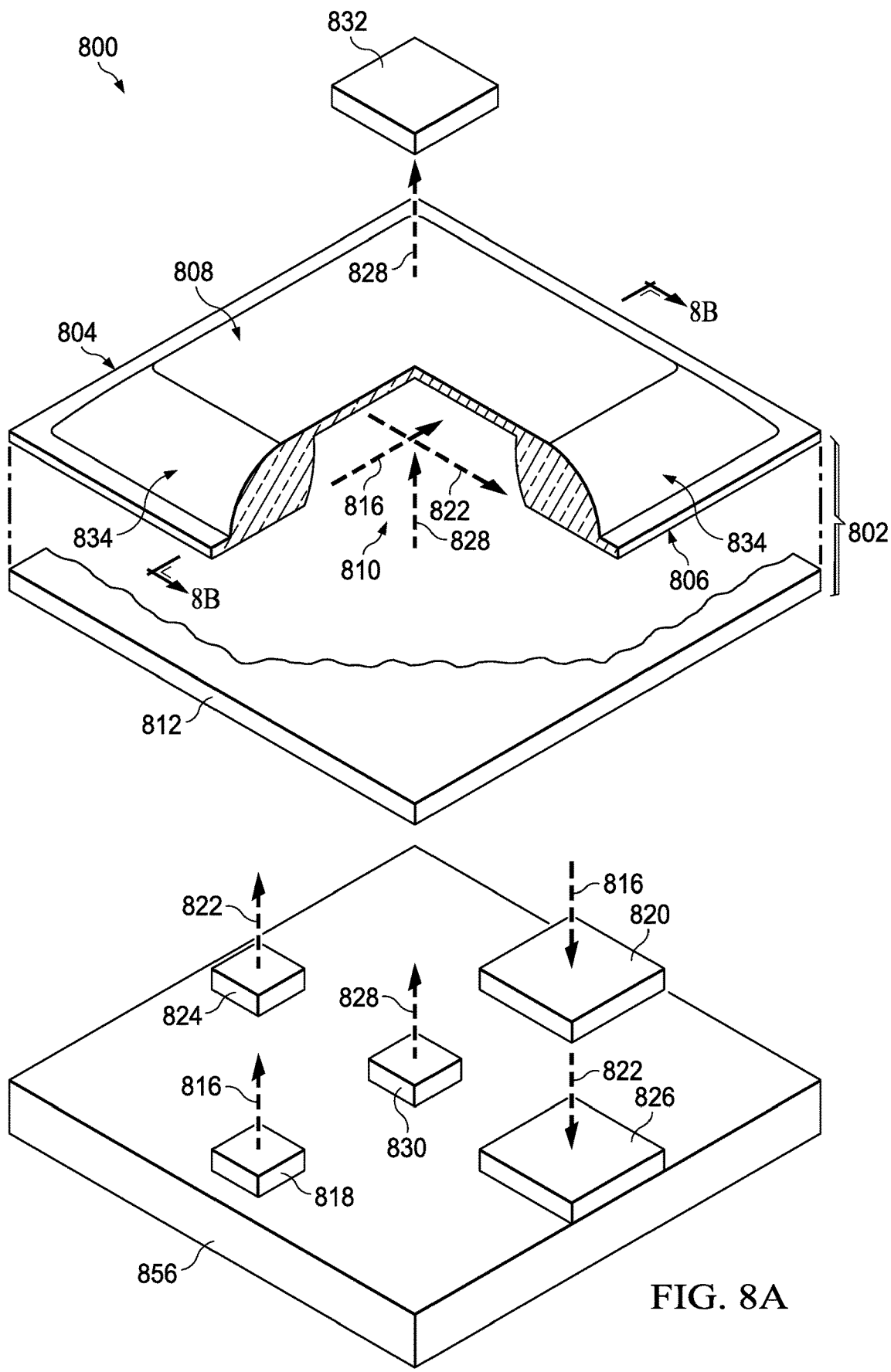
FIG. 8A and FIG. 8B depict another example integrated microfabricated vapor cell sensor.
Figure 8B:
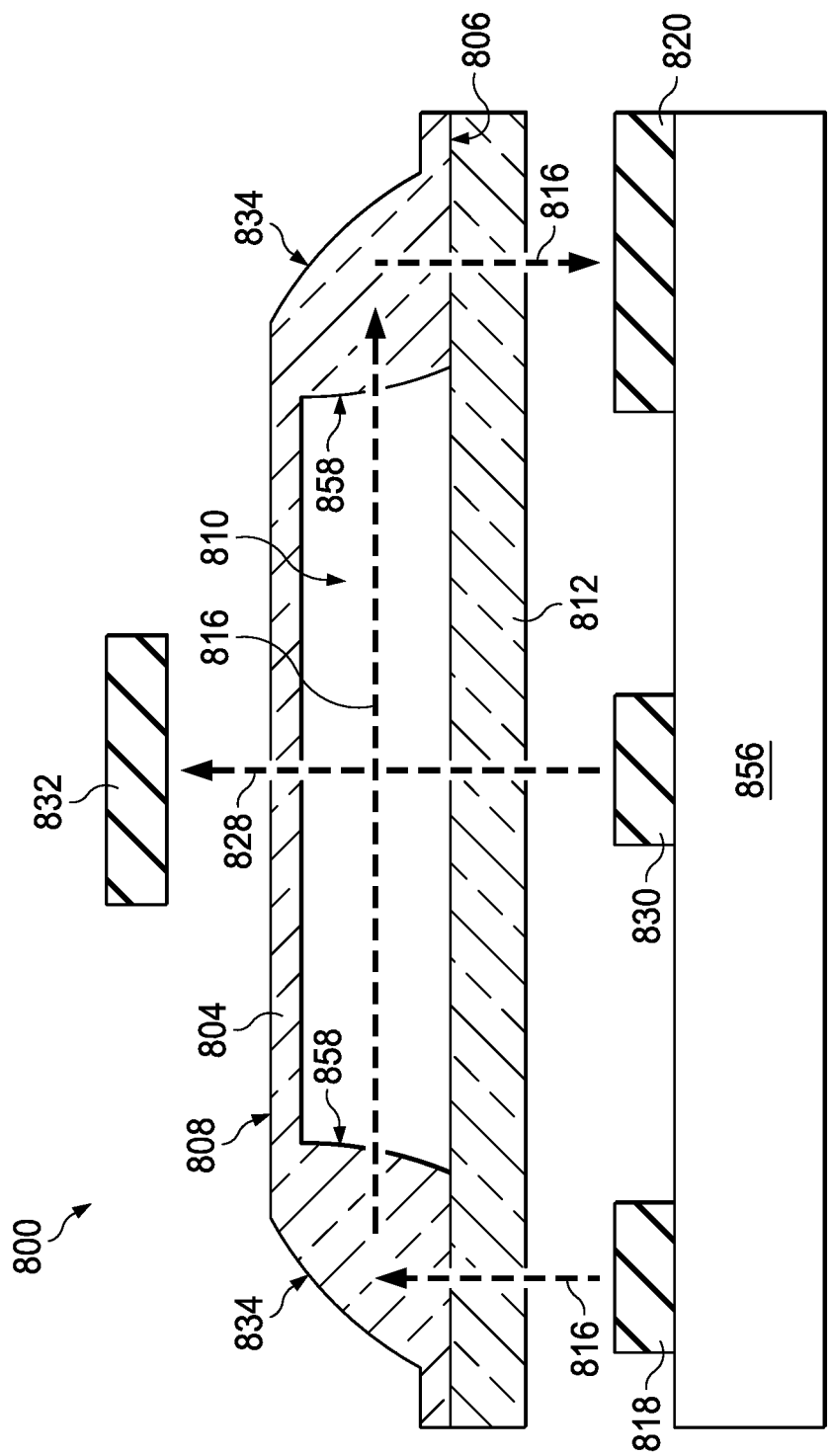

FIG. 8A and FIG. 8B depict another example integrated microfabricated vapor cell sensor. Referring to FIG. 8A, the integrated microfabricated vapor cell sensor 800 includes a sensor cell 802 with a cell body 804 having a first surface 806, a second surface 808, and a cavity 810 extending into the cell body 804. In the instant example, the cell body 804 extends over the cavity 810. A height of the cell body 804 may be about 0.3 millimeters to about 5 millimeters. Lateral dimensions of the cell body 804 may be about 3 millimeters to about 10 millimeters. The sensor cell 802 includes a first plate 812 attached to the cell body 804 at the first surface 806, extending across the cavity 810. Sensor fluid material, not shown, is disposed in the cavity 810. The cell body 804 includes a transparent material suitable for transmission of signals through the cavity 810. In the instant example, the first plate 812 is transparent to the signals.

A first signal path 816 extends from a first signal emitter 818, through the first plate 812, through the cell body 804 and reflecting off an exterior surface 834 of the cell body 804, through the cavity 810, through the cell body 804 and reflecting off the exterior surface 834 again, through the first plate 812 again, and to a first signal detector 820. A second signal path 822 follows a similar path from a second signal emitter 824 to a second signal detector 826. The second signal path 822 intersects the first signal path 816 in the cavity 810, possibly perpendicularly.

An optional third signal path 828 may extend from a third signal emitter 830, through the first plate 812, through the cavity 810, through the cell body 804 where the cell body 804 extends over the cavity 810, and to a third signal detector 832. The third signal path 828 intersects the first signal path 816 in the cavity 810, and may optionally intersect the second signal path 822 in the cavity 810. In some manifestations of the instant example having the third signal emitter 830 and the third signal emitter 832, the second signal emitter 824 and the second signal detector 826 may be omitted.

The first signal emitter 818, the first signal detector 820, the second signal emitter 824, the second signal detector 826, the third signal emitter 830, and the third signal detector 832 are located within 10 millimeters of the cell body 804. For example, the first signal emitter 818, the first signal detector 820, the second signal emitter 824, the second signal detector 826, and the third signal emitter 830 may be mounted on a component substrate 856 of the integrated microfabricated vapor cell sensor 800, as shown in FIG. 8A.

FIG. 8B is a cross section of the integrated microfabricated vapor cell sensor 800 along section line 8B-8B of FIG. 8A. In the instant example, the exterior surfaces 834 of the cell body 804 have convex profiles, which may advantageously reduce divergence of an input signal from the first signal emitter 818 through the cavity 810. Interior surfaces 858 of the cell body 804 may also have convex profiles, to further reduce divergence of the input signal. The interior surfaces 858 are exposed to the cavity 810. During operation of the integrated microfabricated vapor cell sensor 800, an input signal from the first signal emitter 818 passes through the first plate 812 along the first signal path 816 into the cell body 804, is reflected off the exterior surface 834, and passes into the cavity 810. An output signal from the cavity 810 passes into the cell body 804 along the first signal path 816, is reflected off the exterior surface 834, and passes through the first plate 812 to the first signal detector 820.

Figure 9A:
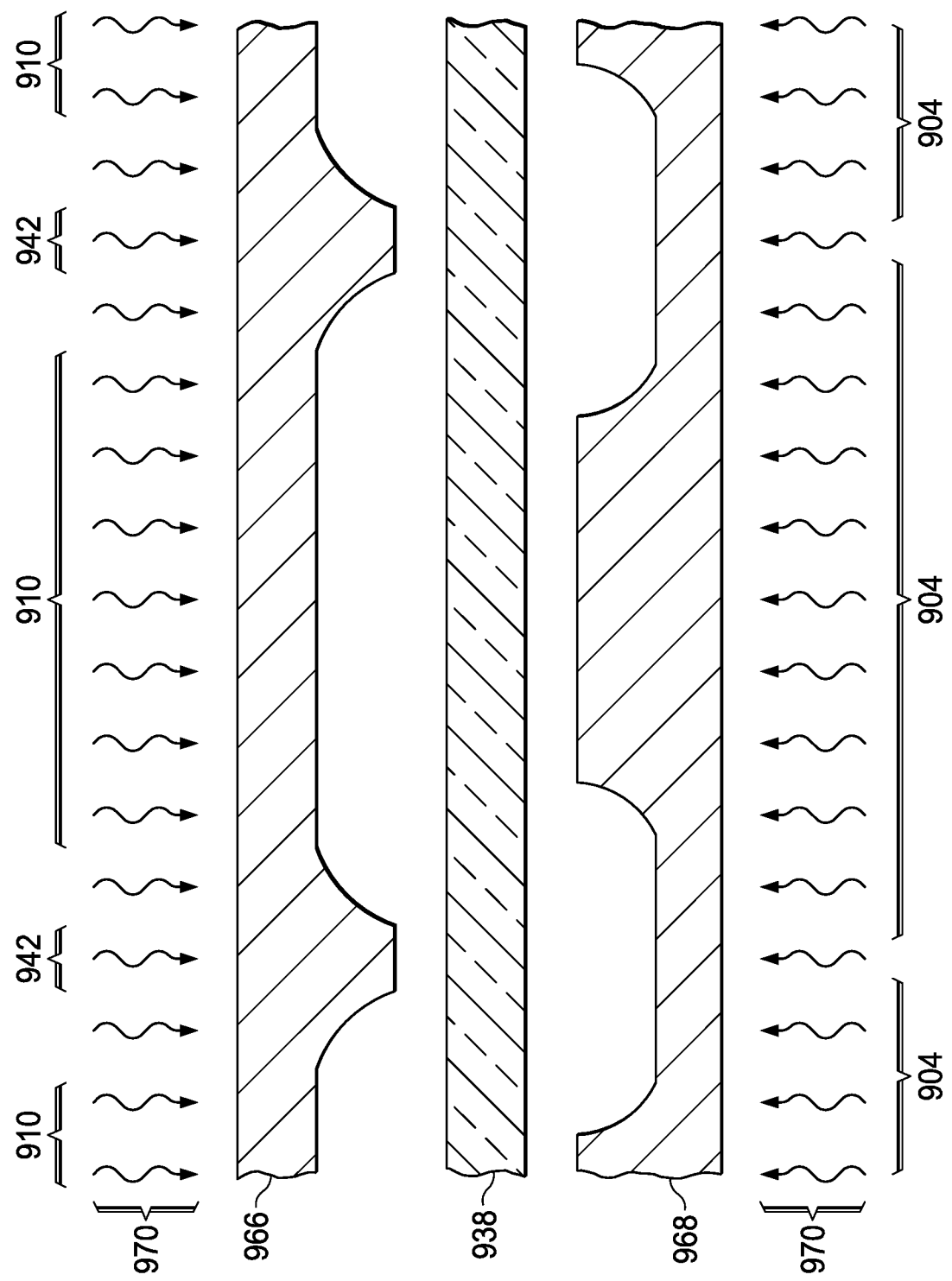
FIG. 9A through FIG. 9C depict a sensor cell, similar to that described in reference to FIG. 8A and FIG. 8B, in successive stages of an example method of formation.
Figure 9B:
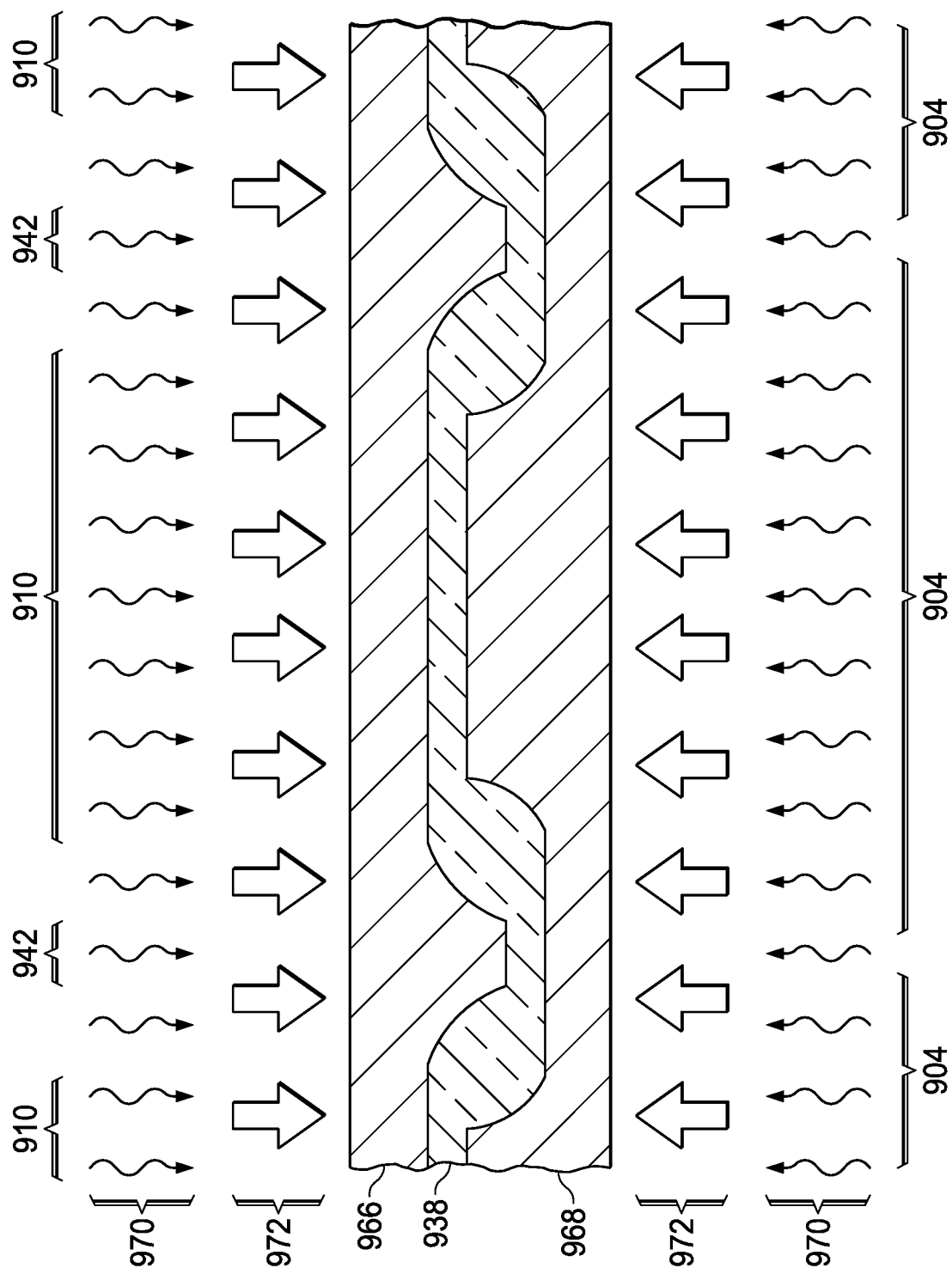
Figure 9C:
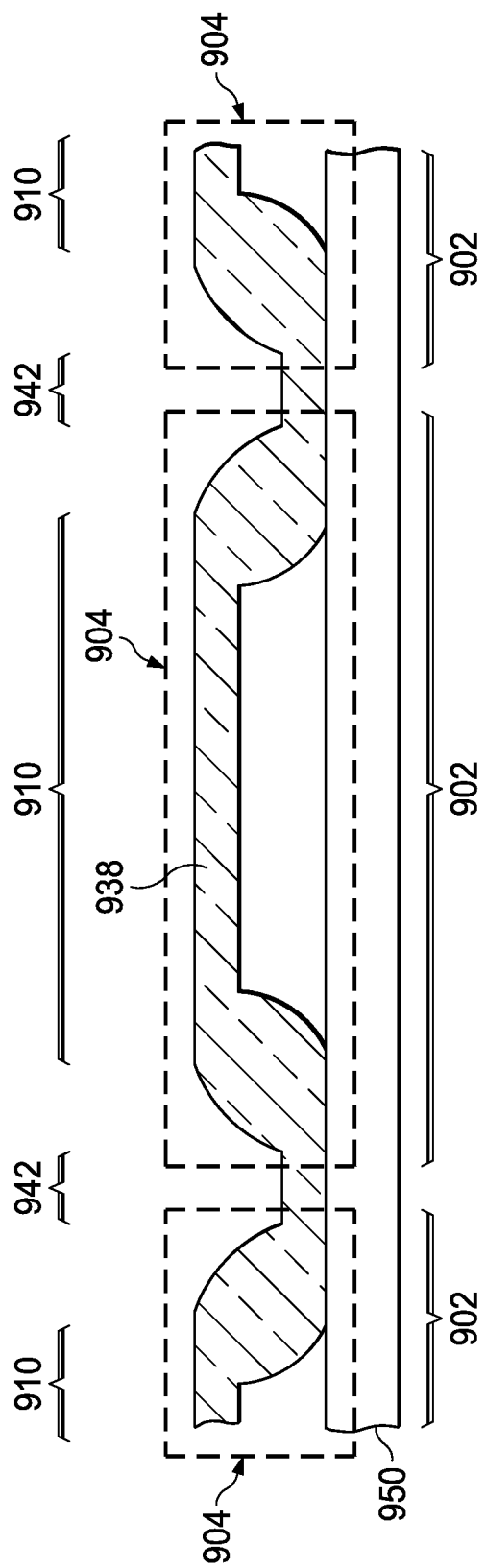

FIG. 9A through FIG. 9C depict a sensor cell, similar to that described in reference to FIG. 8A and FIG. 8B, in successive stages of an example method of formation. Referring to FIG. 9A, a body wafer 938 has areas for multiple cell bodies 904. The body wafer 938 includes transparent material capable of being molded, such as glass, organic polymer, or silicone polymer. The body wafer 938 may be about 0.3 millimeters to about 5 millimeters thick.

An upper mold plate 966 is located above the body wafer 938. The upper mold plate 966 has a lower surface, facing the body wafer 938, with features of an upper surface of the to-be-formed cell bodies 904. A lower mold plate 968 is located below the body wafer 938. The lower mold plate 968 has an upper surface, facing the body wafer 938, with features of a lower surface of the to-be-formed cell bodies 904. The upper mold plate 966 and the lower mold plate 968 may include a material capable of molding the body wafer 938 at a temperature above a softening temperature of the body wafer 938. The upper mold plate 966 and the lower mold plate 968 may include, for example, cast iron, stainless steel, chromium-plated metal, or ceramic.

The body wafer 938, upper mold plate 966, and the lower mold plate 968 are heated so as to make the body wafer 938 suitable for molding the body wafer 938. For example, the body wafer 938, upper mold plate 966, and the lower mold plate 968 may be heated to a softening temperature of the transparent material in the body wafer 938. The body wafer 938, upper mold plate 966, and the lower mold plate 968 may be heated by a radiant heating process 970 as indicated in FIG. 9A. Other methods of heating the body wafer 938, upper mold plate 966, and the lower mold plate 968, such as a hot plate process or using heater plugs, are within the scope of the instant example.

Referring to FIG. 9B, the upper mold plate 966 and the lower mold plate 968 are pressed into the body wafer 938 to mold the transparent material of the body wafer 938 to form the cell bodies 904 separated by the recesses 942. The upper mold plate 966 and the lower mold plate 968 may be pressed into the body wafer 938 using a distributed pressure method 972 as indicated in FIG. 9B, for example using a piston system, an air bladder, or hydraulic pressure. The body wafer 938 is subsequently cooled so as to retain a desired shape after the upper mold plate 966 and the lower mold plate 968 are removed.

Referring to FIG. 9C, sensor fluid material, not shown, is disposed in the cavities 910. A first wafer 950 is attached to the body wafer 938, sealing the cavities 910 and forming sensor cells 902. The body wafer 938 and first wafer 950 are subsequently singulated, separating the sensor cells 902.

Other methods of forming cell bodies having transparent sidewalls may be implemented. Mechanical punching methods, injection molding methods, and three-dimensional printing methods may be used to form cell bodies having features disclosed in the examples herein.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated microfabricated vapor cell sensor, comprising:
    a sensor cell, comprising:
        a cell body comprising a transparent material, the cell body having a cavity extending to a first surface of the cell body;
        sensor fluid material in the cavity; and
        a first plate attached to the cell body on the first surface, wherein the first plate extends across the cavity;
    a first signal emitter located outside of the cavity and within 10 millimeters of the cell body;
    a first signal detector located outside of the cavity and within 10 millimeters of the cell body, wherein a first signal path extends from the first signal emitter, through the first plate, through the transparent material of the cell body and reflecting off a first surface of the cell body, through the cavity, through the cell body, reflecting off a second surface of the cell body, through the first plate again, and to the first signal detector;
    a second signal emitter located outside of the cavity and within 10 millimeters of the cell body; and
    a second signal detector located outside of the cavity and within 10 millimeters of the cell body, wherein a second signal path extends from the second signal emitter, through the first plate, through the transparent material of the cell body and reflecting off a third surface of the cell body, through the cavity, through the cell body, reflecting off a fourth surface of the cell body, through the first plate again, and to the second signal detector, and wherein the second signal path intersects the first signal path in the cavity.

2. The integrated microfabricated vapor cell sensor of claim 1, wherein the transparent material comprises a material selected from the group consisting of glass, fused quartz, photosensitive glass, sapphire, organic polymer, and silicone polymer.

3. The integrated microfabricated vapor cell sensor of claim 1, wherein the second signal path is perpendicular to the first signal path in the cavity.

4. The integrated microfabricated vapor cell sensor of claim 1, wherein exterior surfaces of the cell body are sloped at an angle of approximately 45 degrees with respect to the first surface, and interior surfaces of the cell body are oriented at approximately 90 degrees with respect to the first surface.

5. The integrated microfabricated vapor cell sensor of claim 1, wherein exterior surfaces of the cell body are sloped at an angle between 45 degrees and 60 degrees with respect to the first surface, and interior surfaces of the cell body are oriented at the same angle with respect to the first surface.

6. The integrated microfabricated vapor cell sensor of claim 1, wherein the cell body has a second surface located opposite from the first surface, and the cavity extends to the second surface; and
    the sensor cell further comprises a second plate attached to the cell body on the second surface, wherein the second plate extends across the cavity.

7. The integrated microfabricated vapor cell sensor of claim 6, wherein the second plate is transparent, the first plate is transparent, and the second signal path extends through the first plate and through the second plate.

8. The integrated microfabricated vapor cell sensor of claim 1, wherein the cell body extends across the cavity, opposite from the first plate.

9. The integrated microfabricated vapor cell sensor of claim 8, wherein exterior surfaces of the cell body have convex profiles.

10. The integrated microfabricated vapor cell sensor of claim 4, wherein the second plate is transparent, the first plate is transparent, and the second signal path extends through the transparent material of the cell body; and further comprising:
    a third signal emitter located outside of the cavity and within 10 millimeters of the cell body; and
    a third signal detector located outside of the cavity and within 10 millimeters of the cell body, wherein a third signal path extends from the third signal emitter, through the first plate, through the cavity, through the second plate, and to the third signal detector, and wherein the third signal path intersects the first signal path in the cavity.

11. A method of forming an integrated microfabricated vapor cell sensor, comprising:
    providing a body wafer comprising a transparent material;
    forming multiple cavities extending through the body wafer;

forming multiple recess areas extending through the body wafer between the cavities to form individual cell bodies;

attaching a first wafer to the body wafer, extending across the cavity;

disposing sensor fluid material in the cavity;

attaching a second wafer to the body wafer, opposite from the first wafer, the second wafer extending across the cavity; and singulating the first wafer, the body wafer, and the second wafer through the center of the recess areas in the body wafer to form a sensor cell, comprising a cell body of the body wafer, a first plate of the first wafer, and a second plate of the second wafer.

12. The method of claim 11, wherein the transparent material comprises a material selected from the group consisting of glass, fused quartz, photosensitive glass, sapphire, organic polymer, and silicone polymer.

13. The method of claim 11, wherein forming the cavity comprises:

forming an etch mask over the body wafer, the etch mask exposing an area for the cavity;

removing material from the body wafer where exposed by the etch mask using a deep reactive ion etch (DRIE) process; and removing the etch mask.

14. The method of claim 11, wherein the body wafer comprises a photosensitive glass, and forming the cavity comprises:

forming an exposure mask over the body wafer, the exposure mask exposing an area for the cavity;

exposing the body wafer to ultraviolet light where exposed by the exposure mask;

heating the body wafer to convert the photosensitive glass where exposed to the ultraviolet light to form a polycrystalline region;

removing the polycrystalline region; and removing the exposure mask.

15. The method of claim 11, wherein forming the cavity comprises removing material from the body wafer around a boundary of the cavity using a fluid jet.

16. The method of claim 11, wherein forming the cavity comprises:

forming an erodible etch mask over the body wafer, the erodible etch mask exposing an area for the cavity;

removing material from the body wafer where exposed by the erodible etch mask using a reactive ion etch (RIE) process, wherein the RIE process removes material from the erodible etch mask, so that lateral boundaries of the erodible etch mask recede during the RIE process, forming sloped surfaces in the body wafer at interior surfaces of the cell body and exterior surfaces of the cell body; and removing the erodible etch mask.

17. A method of forming an integrated microfabricated vapor cell sensor, comprising:

providing a body wafer comprising a transparent material;

heating the body wafer;

pressing an upper mold plate into the body wafer and pressing a lower mold plate into the body wafer, to form a series of cell bodies separated by recesses, each cell body having a cavity extending to a first surface of the cell body, wherein material of the body wafer extends over the cavity;

cooling the body wafer;

removing the upper mold plate and the lower mold plate;

disposing sensor fluid material in the cavity;

attaching a first wafer to the body wafer, extending across the cavity; and singulating the body wafer and the first wafer to form a sensor cell, comprising a cell body of the body wafer, a first plate of the first wafer.

18. The method of claim 17, wherein the transparent material comprises a material selected from the group consisting of glass and organic polymer.

* * * * *